United States Patent
Lee et al.

(10) Patent No.: US 12,058,935 B2
(45) Date of Patent: Aug. 6, 2024

(54) THERMOELECTRIC DEVICE

(71) Applicant: LG INNOTEK CO., LTD., Seoul (KR)

(72) Inventors: Se Woon Lee, Seoul (KR); Jong Hyun Kim, Seoul (KR); Young Sam Yoo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 41 days.

(21) Appl. No.: 17/913,982

(22) PCT Filed: Mar. 2, 2021

(86) PCT No.: PCT/KR2021/002553
§ 371 (c)(1),
(2) Date: Sep. 23, 2022

(87) PCT Pub. No.: WO2021/194111
PCT Pub. Date: Sep. 30, 2021

(65) Prior Publication Data
US 2023/0124140 A1 Apr. 20, 2023

(30) Foreign Application Priority Data

Mar. 23, 2020 (KR) .................. 10-2020-0035163
Mar. 25, 2020 (KR) .................. 10-2020-0036425

(51) Int. Cl.
*H10N 10/17* (2023.01)
*H10N 10/13* (2023.01)

(52) U.S. Cl.
CPC ............. *H10N 10/17* (2023.02); *H10N 10/13* (2023.02)

(58) Field of Classification Search
None
See application file for complete search history.

(56) References Cited

U.S. PATENT DOCUMENTS

2009/0236087 A1 9/2009 Horio
2012/0057305 A1* 3/2012 Morisaku ............... H10N 10/13
361/720

FOREIGN PATENT DOCUMENTS

JP 2007-93106 A 4/2007
JP 2007-123564 A 5/2007
(Continued)

*Primary Examiner* — Eli S Mekhlin
(74) *Attorney, Agent, or Firm* — Birch, Stewart, Kolasch & Birch, LLP

(57) ABSTRACT

According to an embodiment, disclosed is a thermoelectric device comprising: a thermoelectric element comprising a first substrate, a plurality of first electrodes disposed on the first substrate, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, and a second substrate disposed on the plurality of second electrodes; and a heat sink comprising a plurality of fins disposed to be spaced apart on the second substrate, wherein the second substrate comprises a first region overlapping the second electrodes in a vertical direction and a second region not overlapping the second electrodes in the vertical direction, and wherein separation distances between adjacent fins of the plurality of fins are different from each other in the first region and the second region.

8 Claims, 30 Drawing Sheets

(56) References Cited

FOREIGN PATENT DOCUMENTS

| JP | 2009-260303 A | 11/2009 |
| KR | 10-2018-0029746 A | 3/2018 |
| WO | WO 2016/136856 A1 | 9/2016 |

* cited by examiner

[FIG. 1]
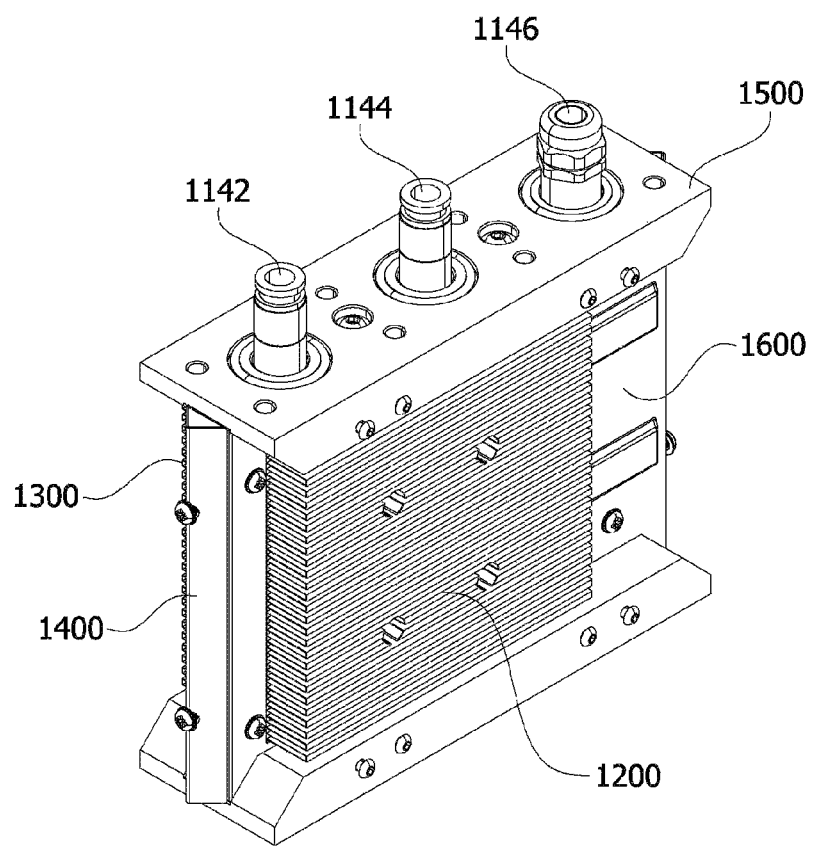

[FIG. 2]
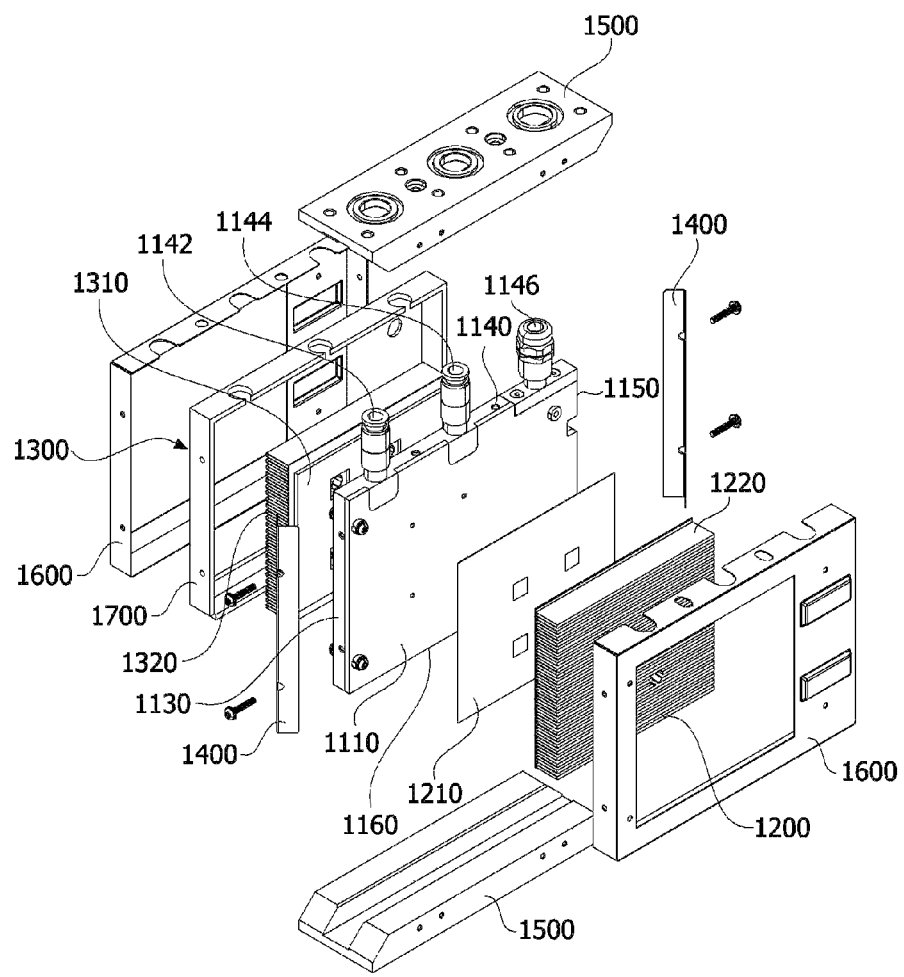
1100: 1110, 1120, 1130, 1140, 1150, 1160

[FIG. 3]
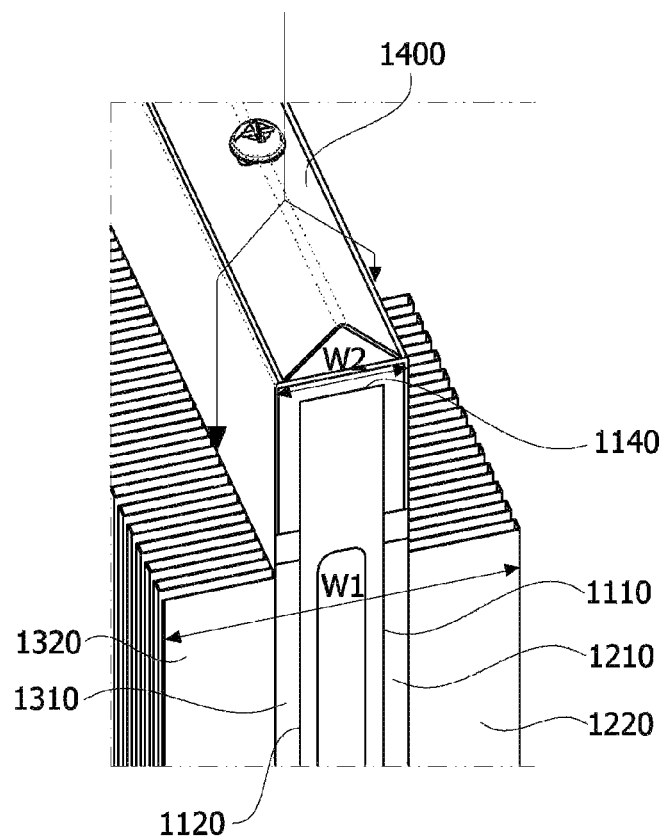

[FIG. 4]
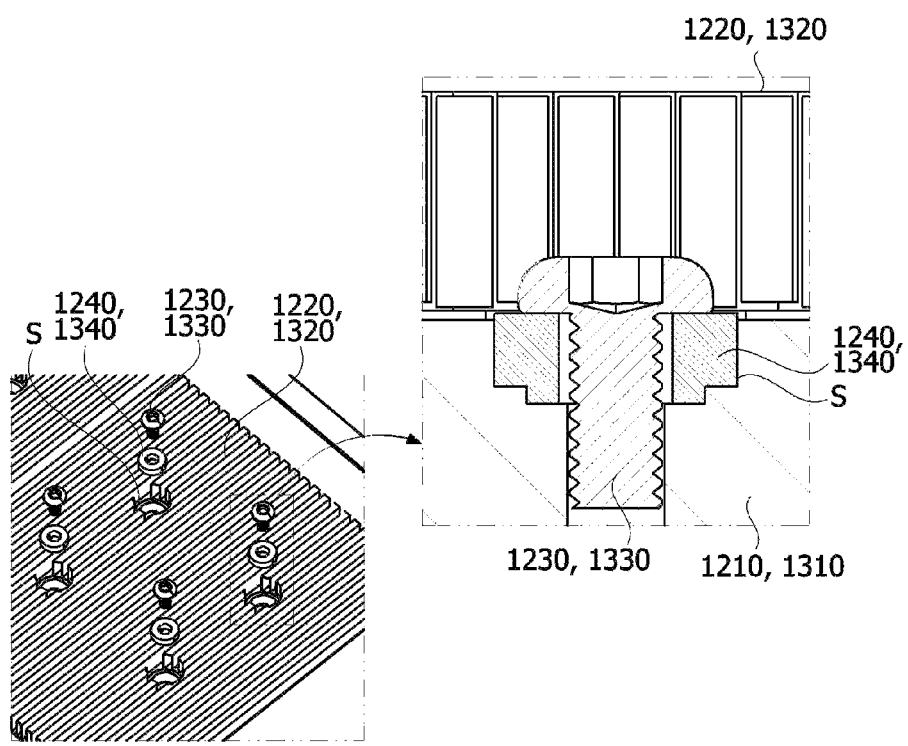

[FIG. 5]
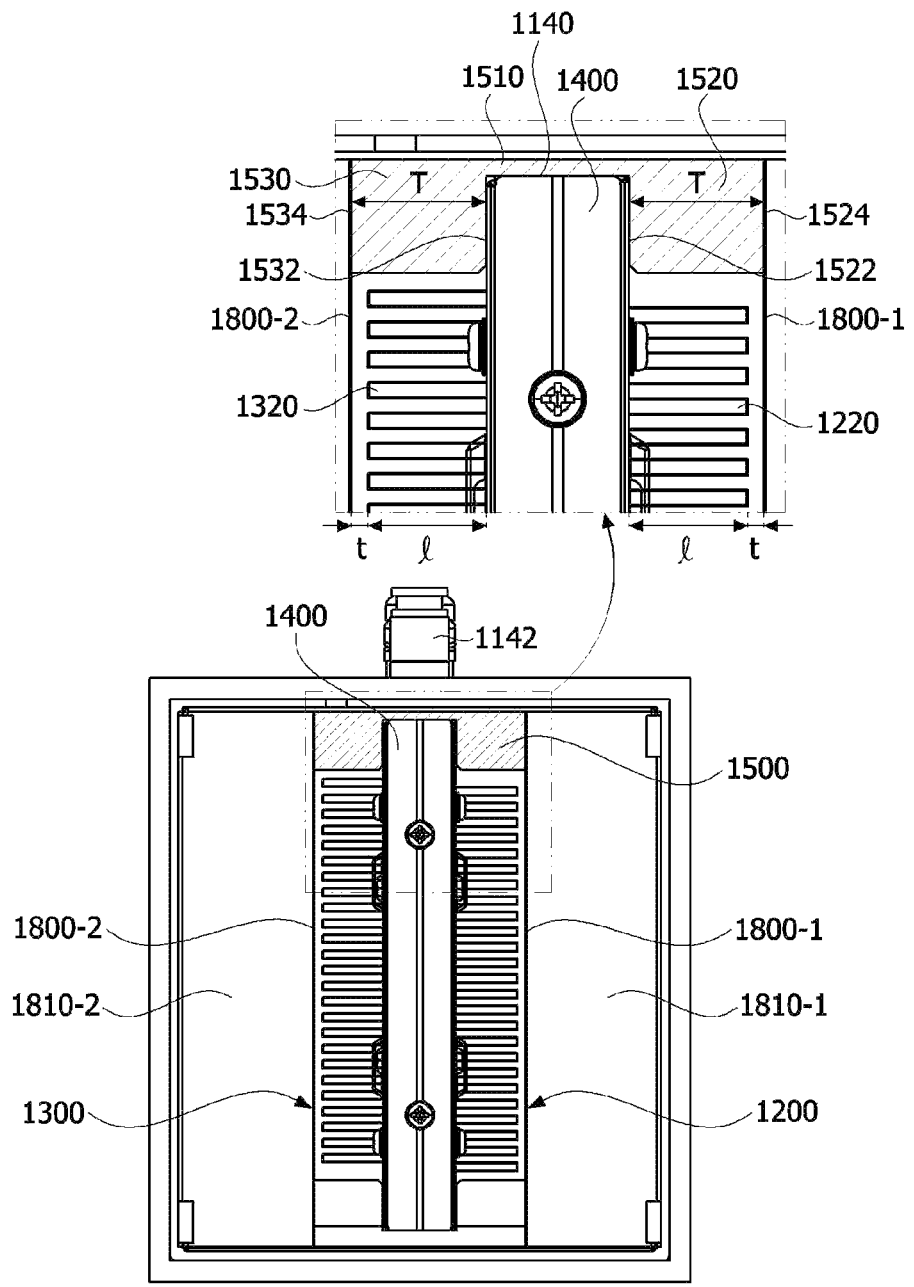

[FIG. 6]
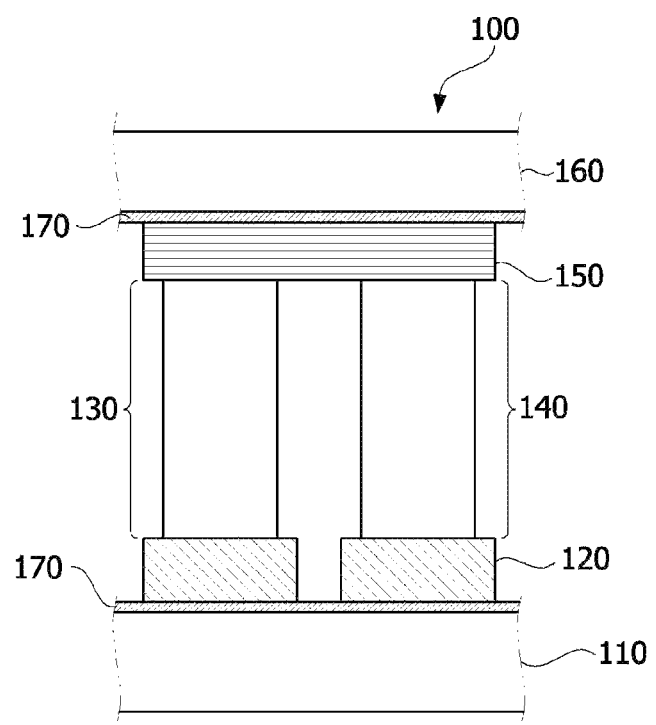

[FIG. 7]
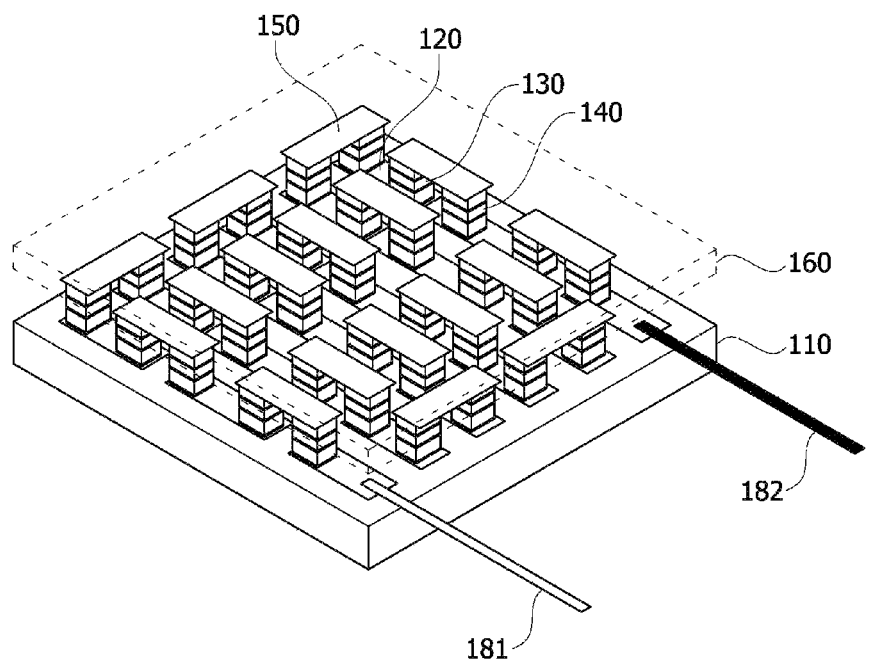

[FIG. 8]
TD
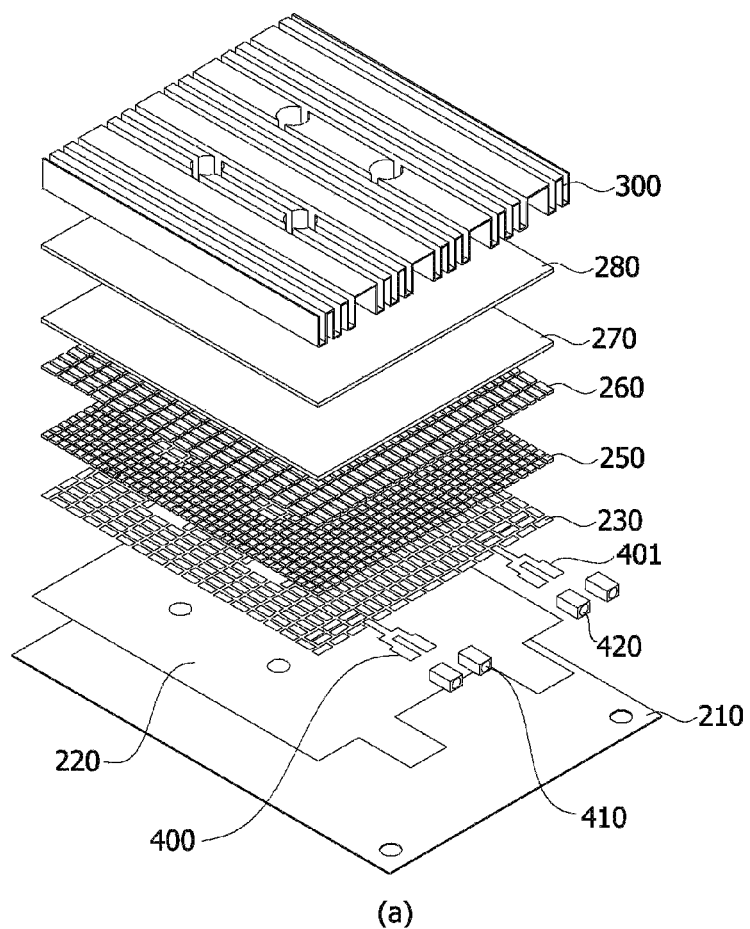
(a)
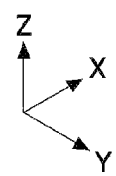

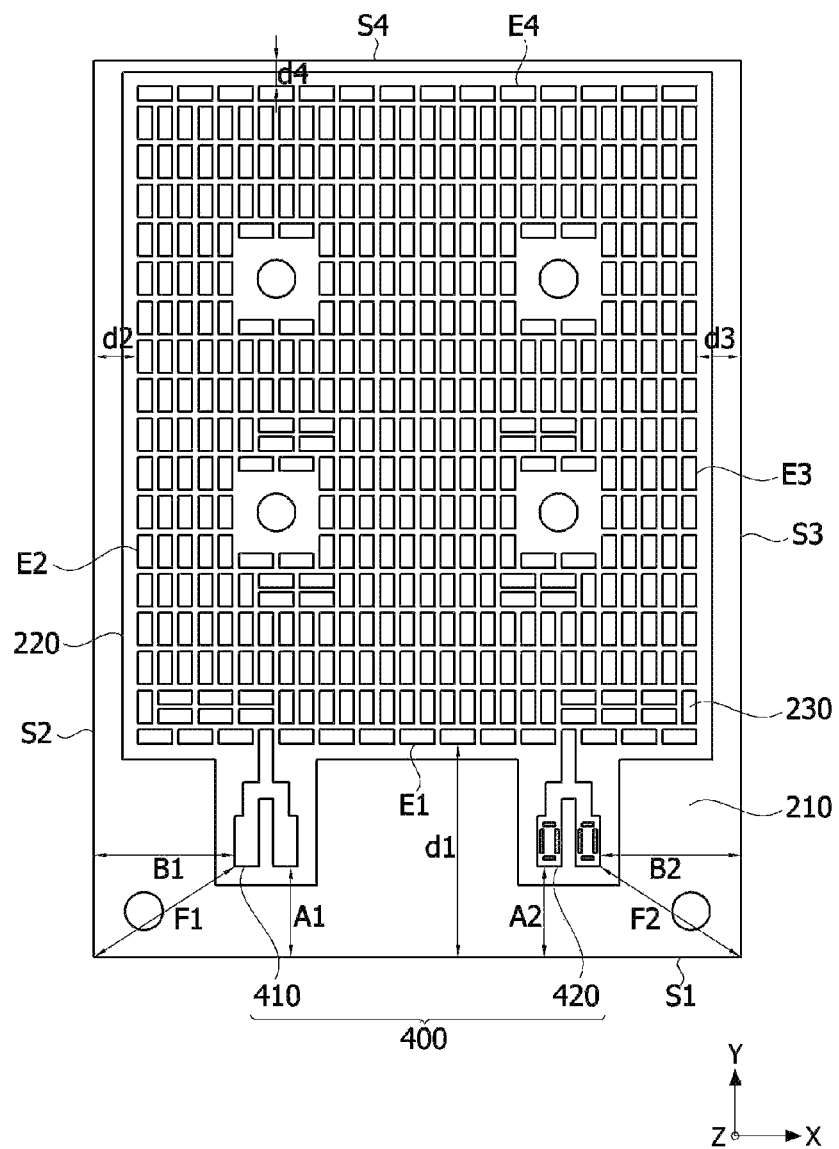
[FIG. 9]

[FIG. 10]
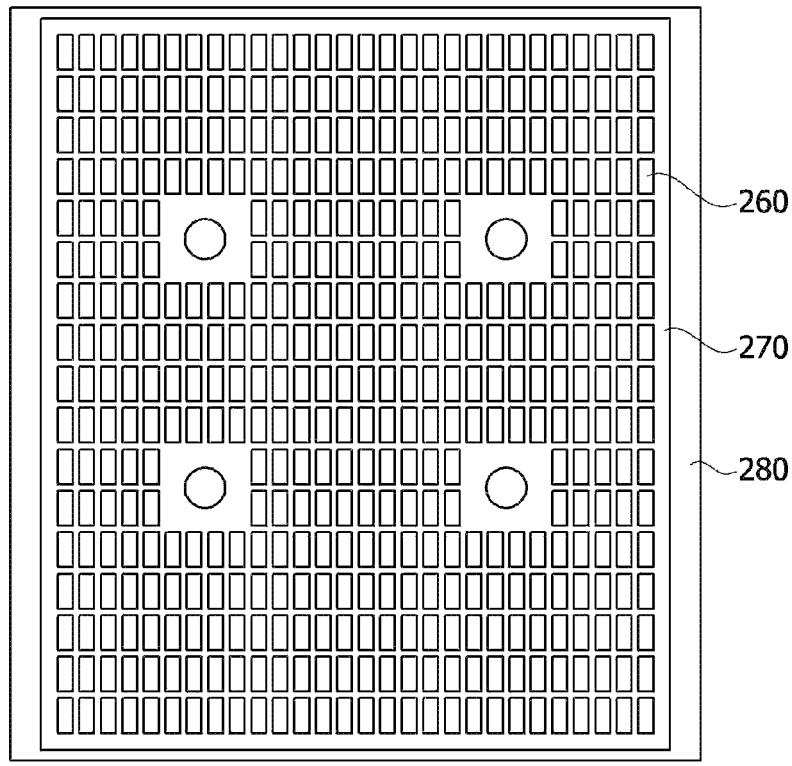
[FIG. 11]
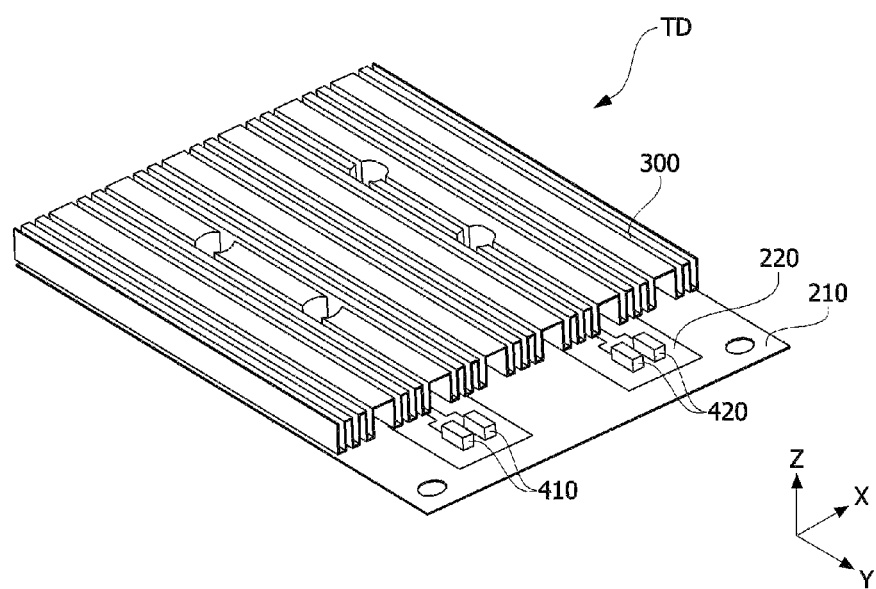

[FIG. 12]
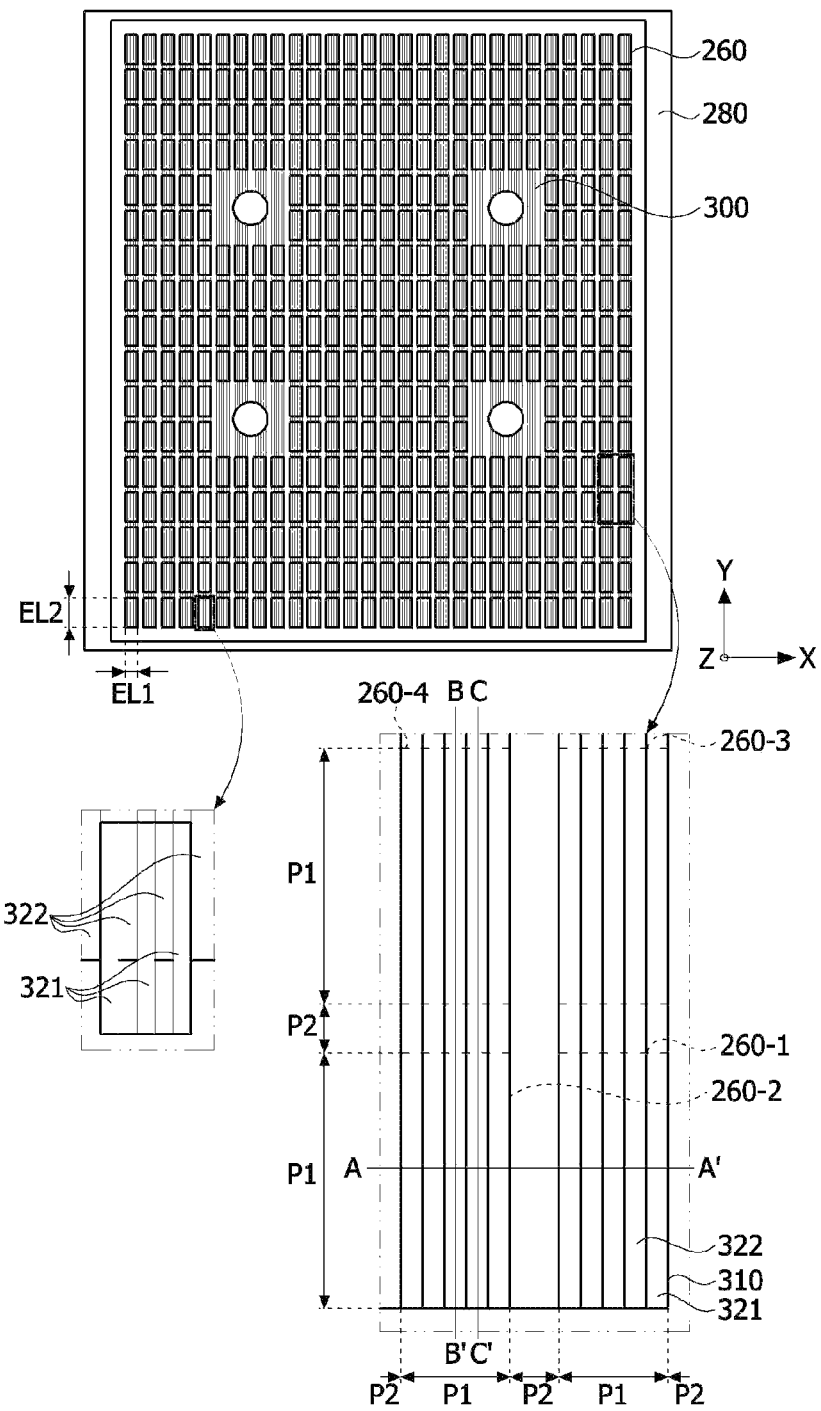

[FIG. 13]
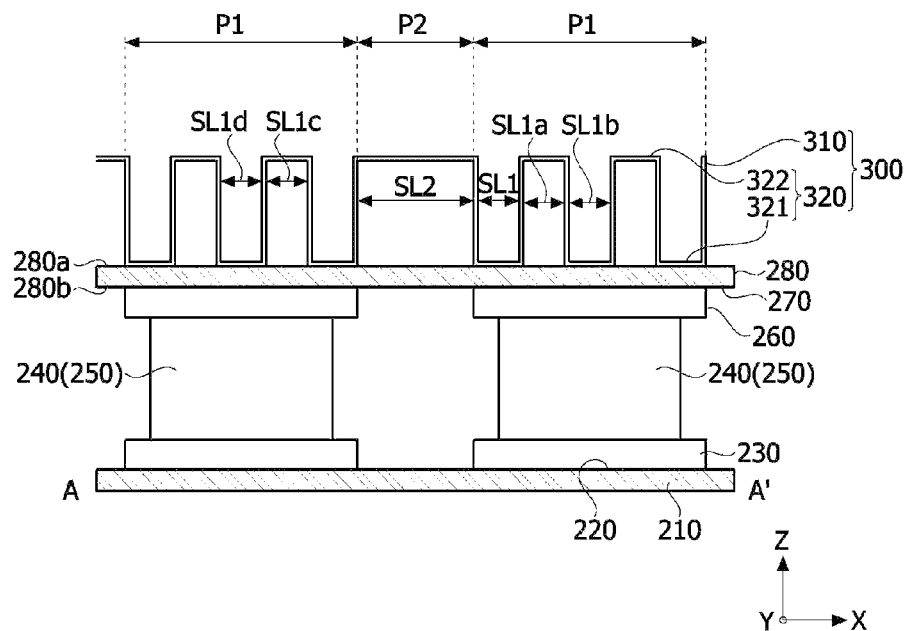
[FIG. 14]
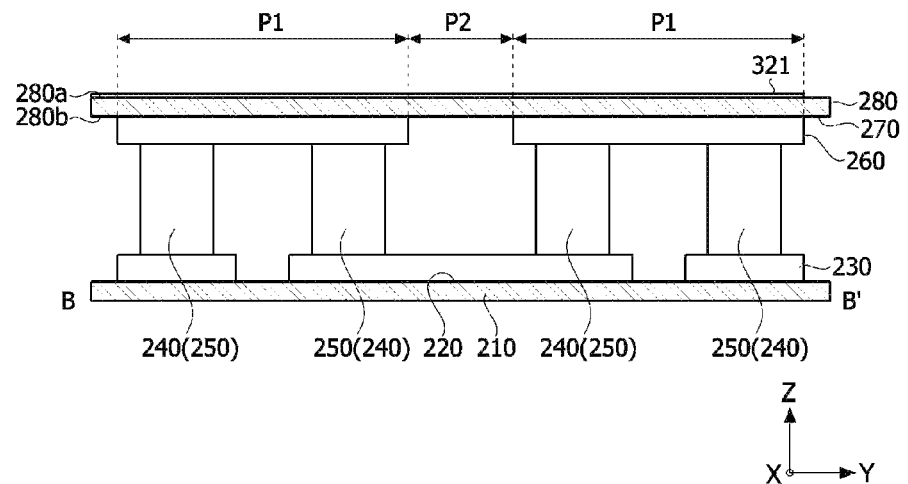

[FIG. 15]
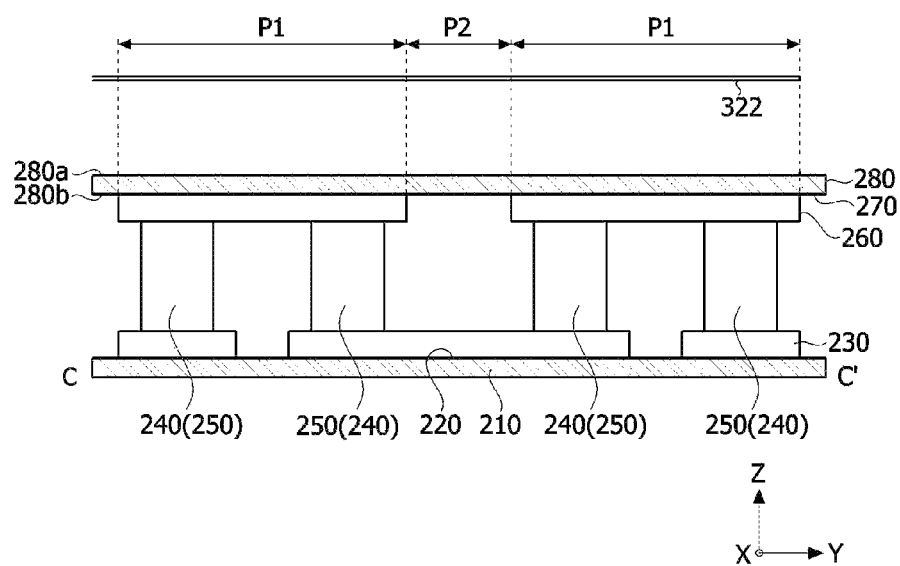

[FIG. 16]
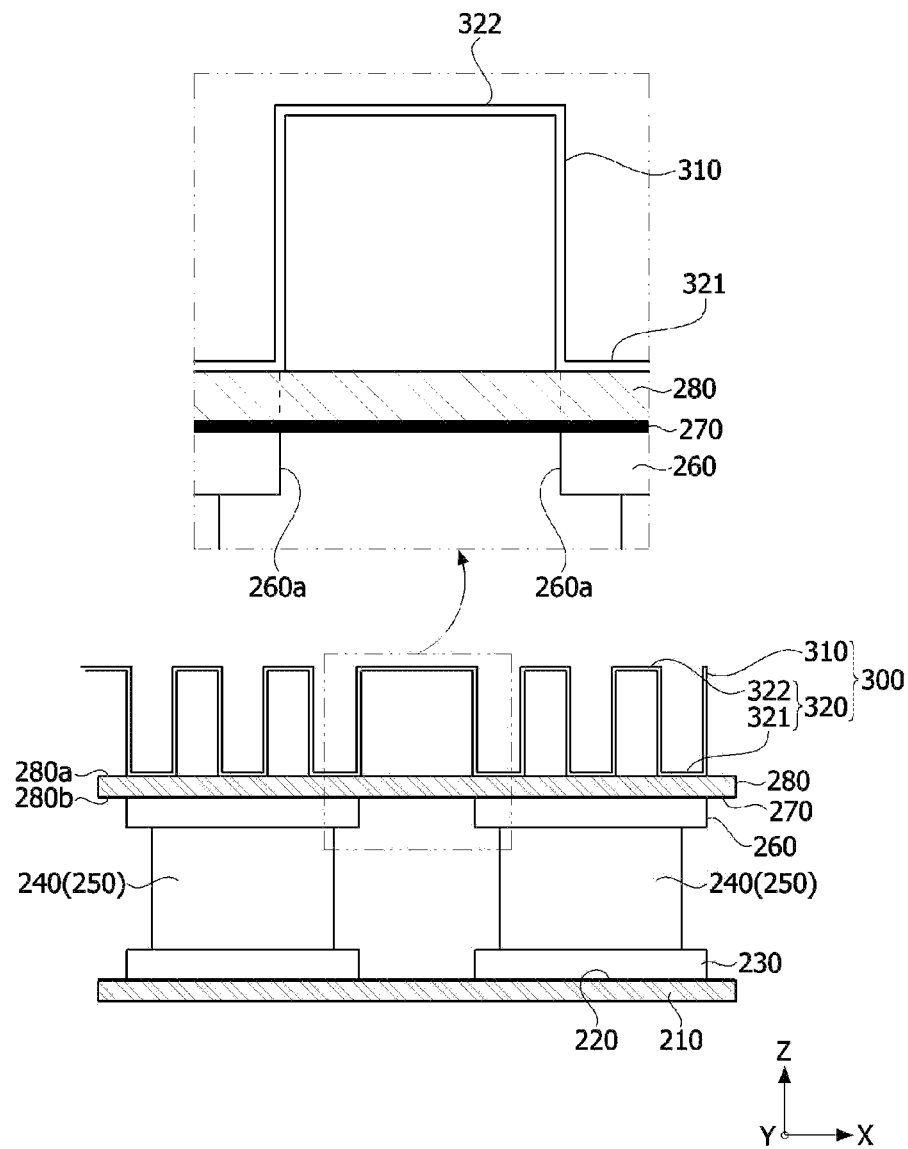

[FIG. 17]
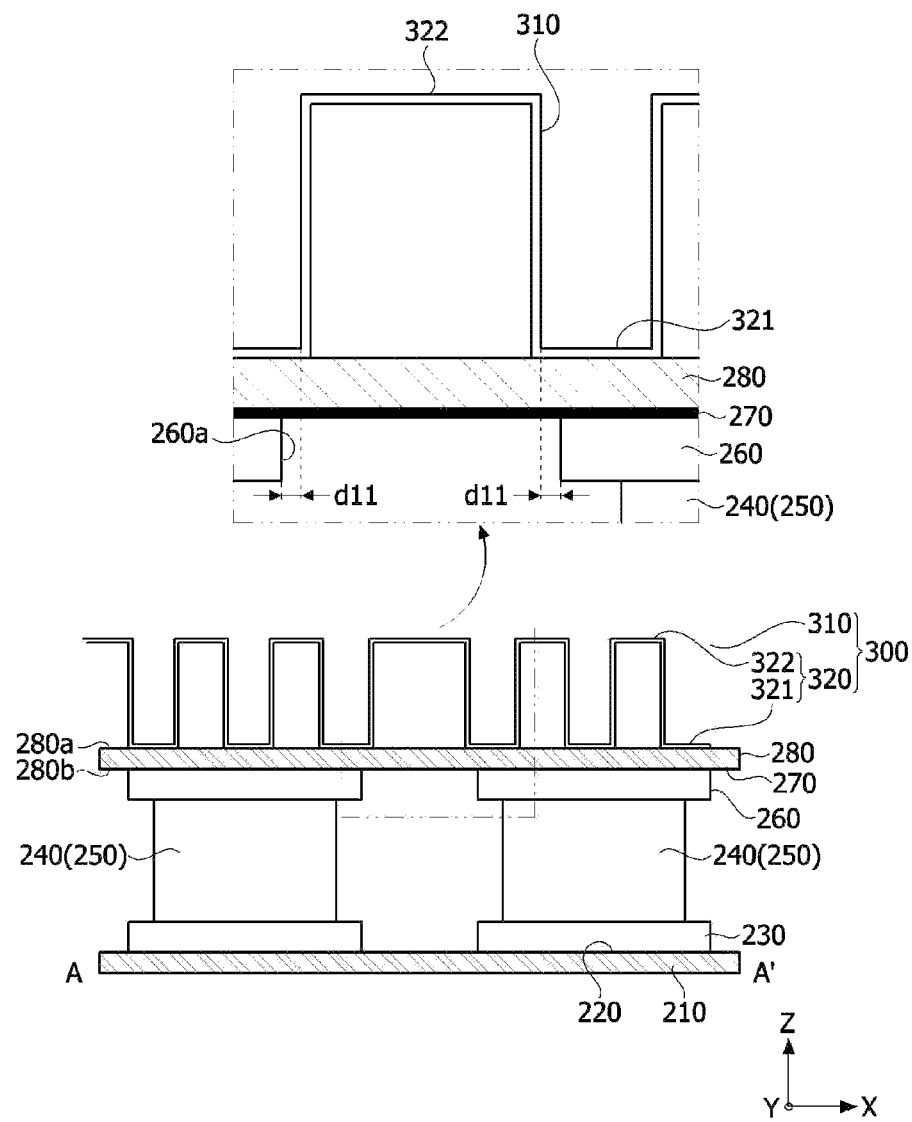

[FIG. 18]
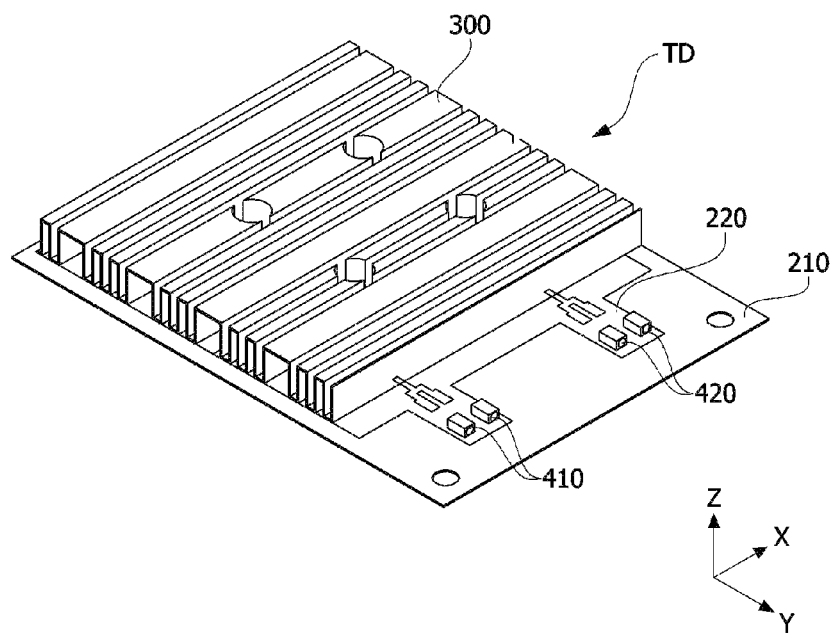

[FIG. 19]
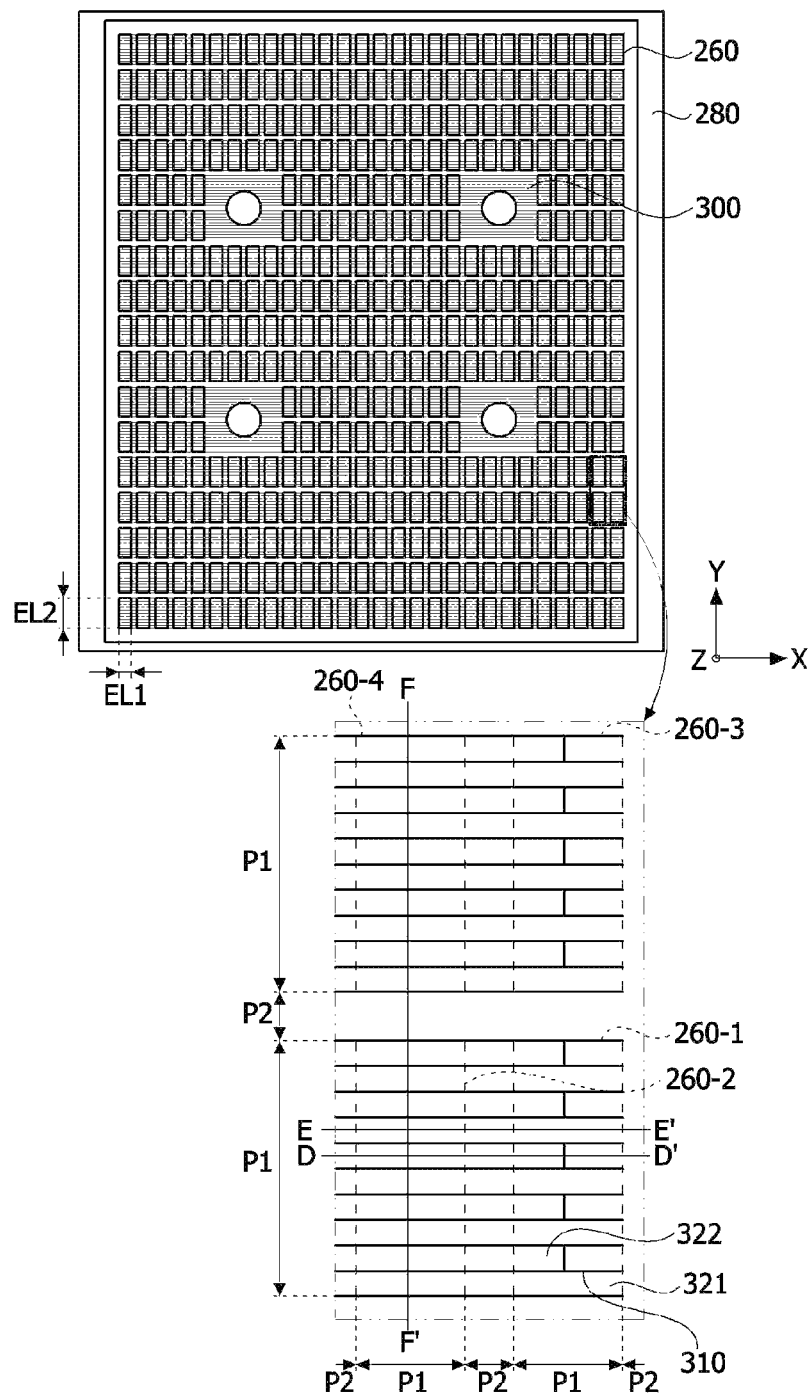

[FIG. 20]
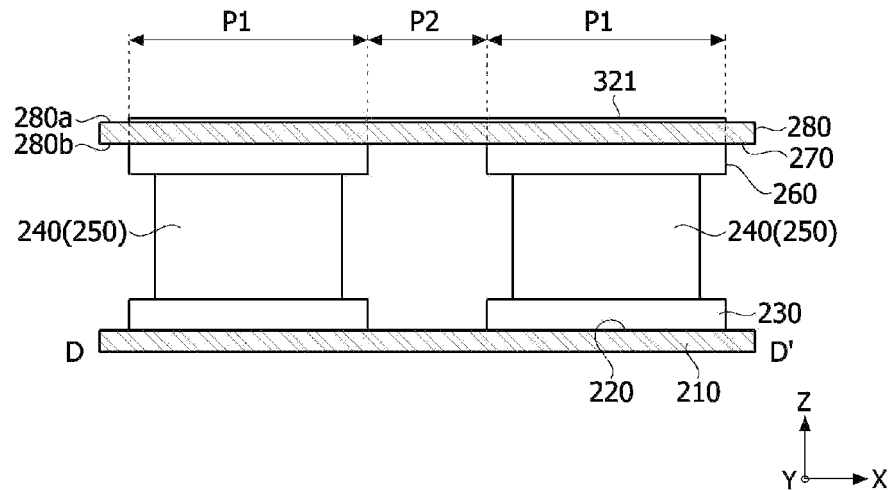
[FIG. 21]
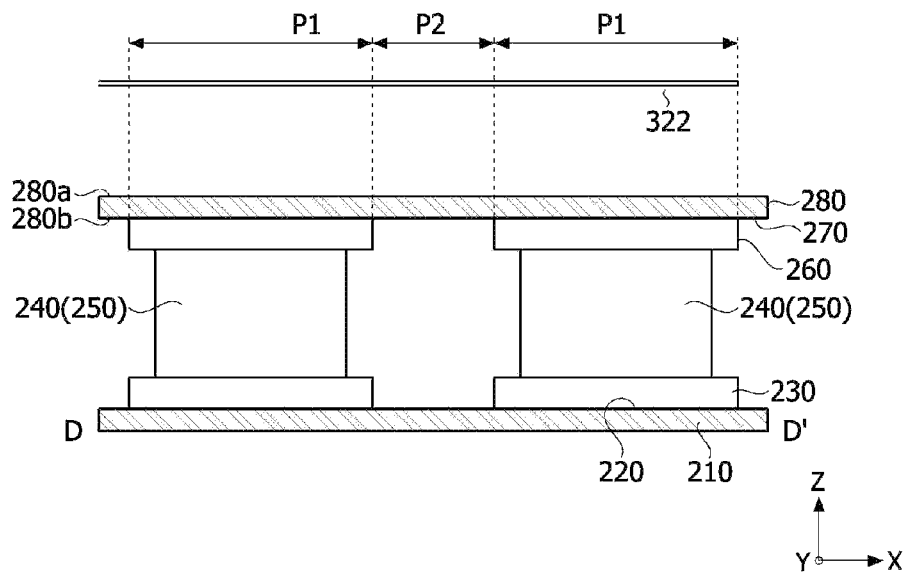

[FIG. 22]
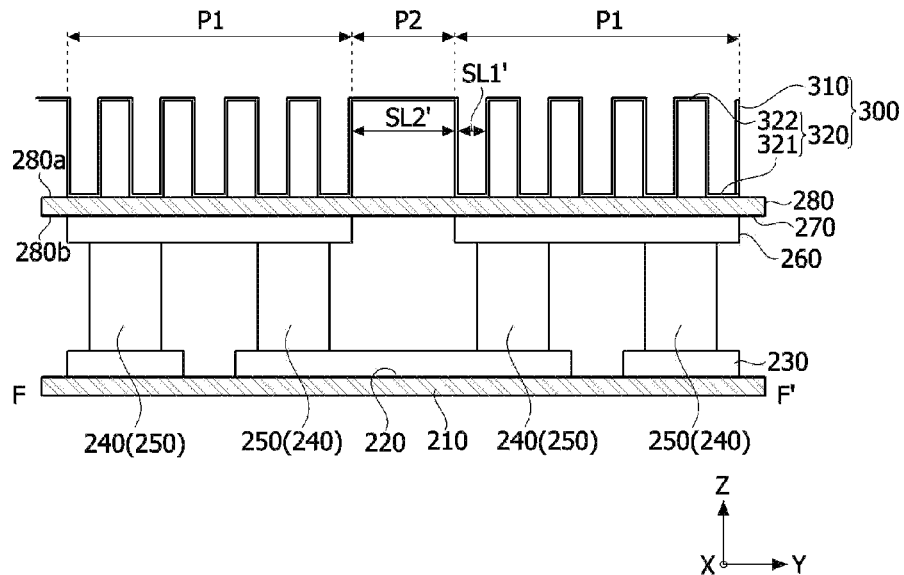
[FIG. 23]
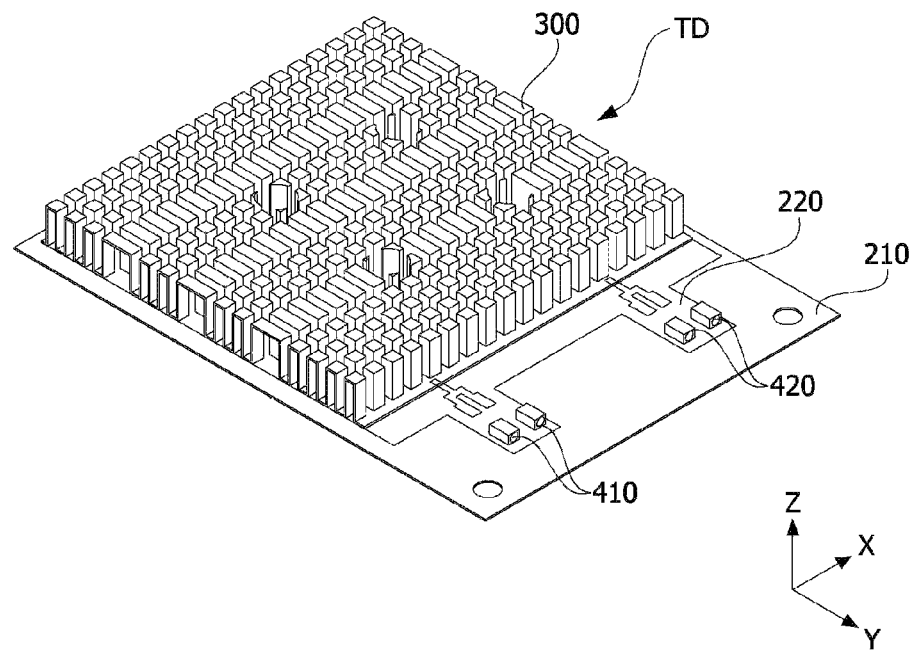

[FIG. 24]
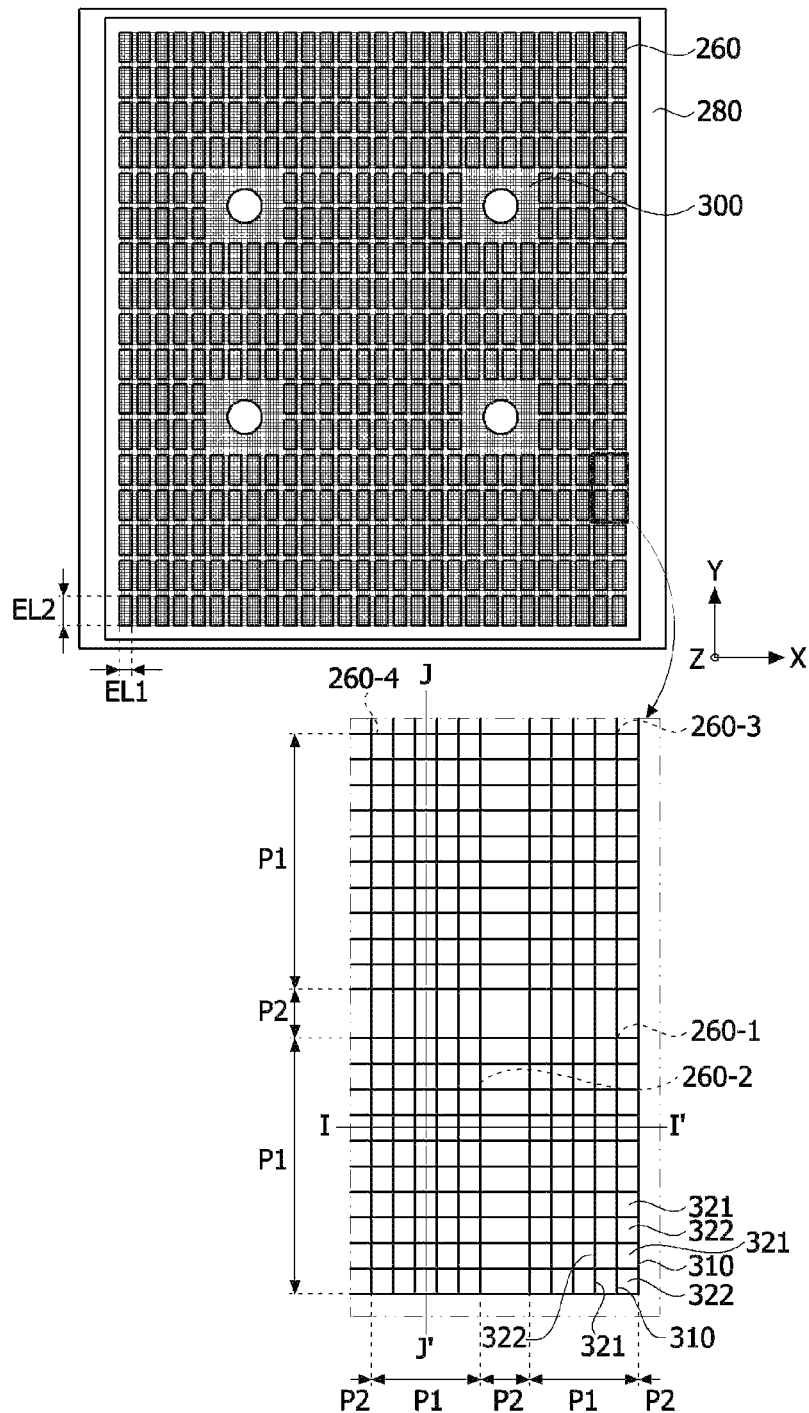

[FIG. 25]
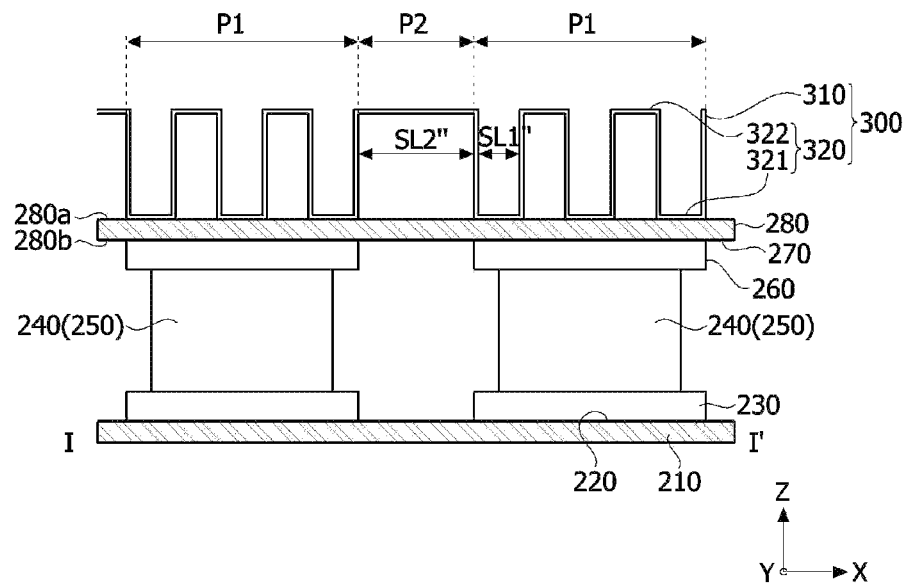
[FIG. 26]
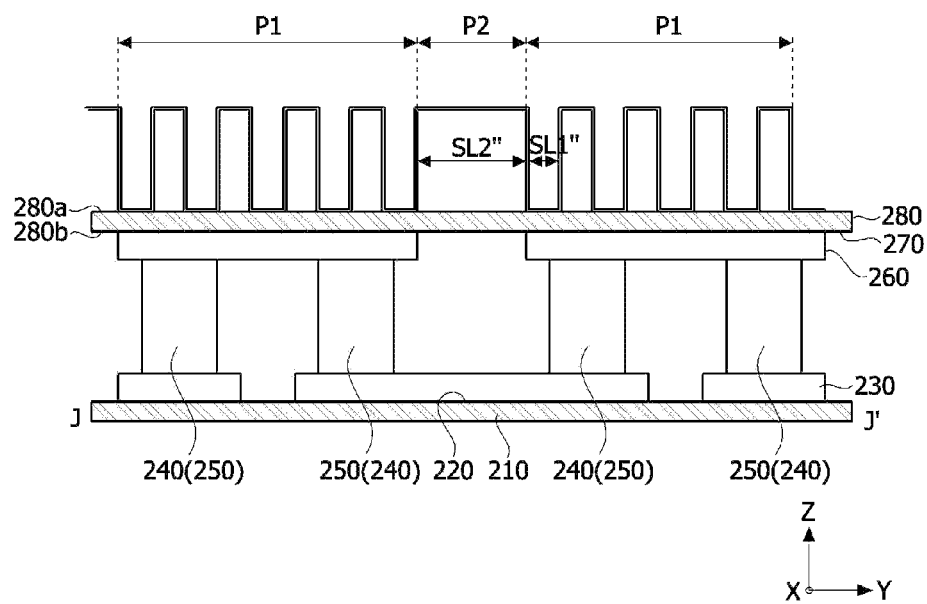

[FIG. 27]
TD
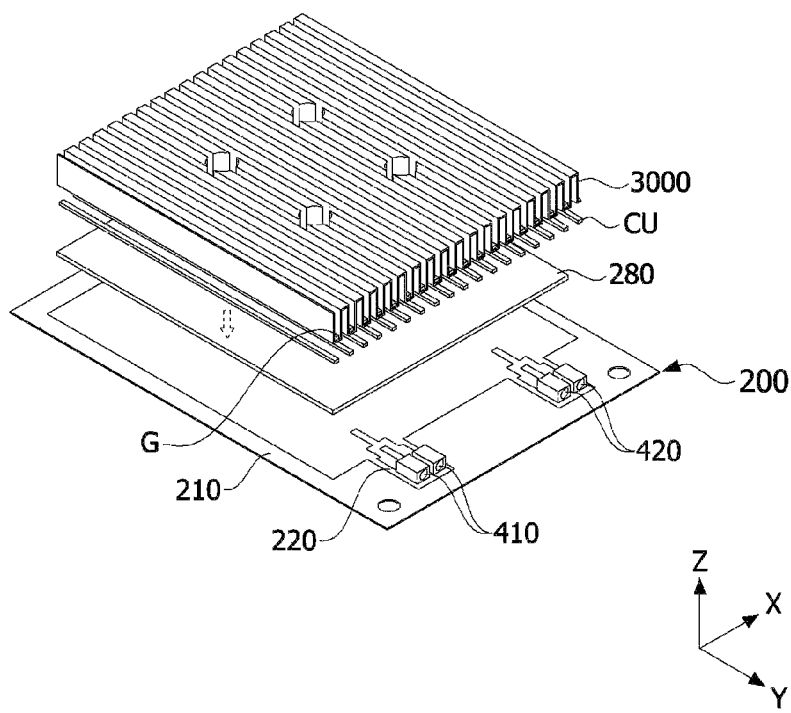

[FIG. 28]
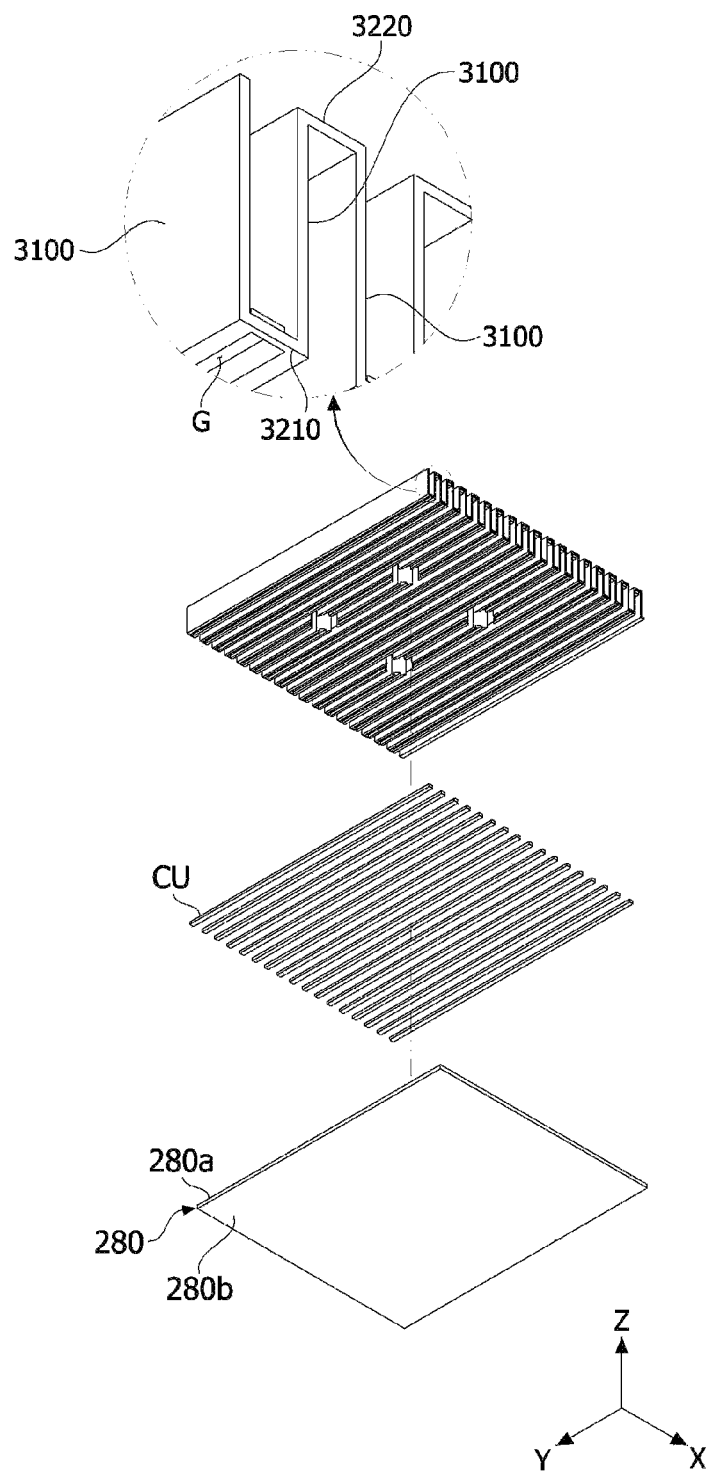

[FIG. 29]
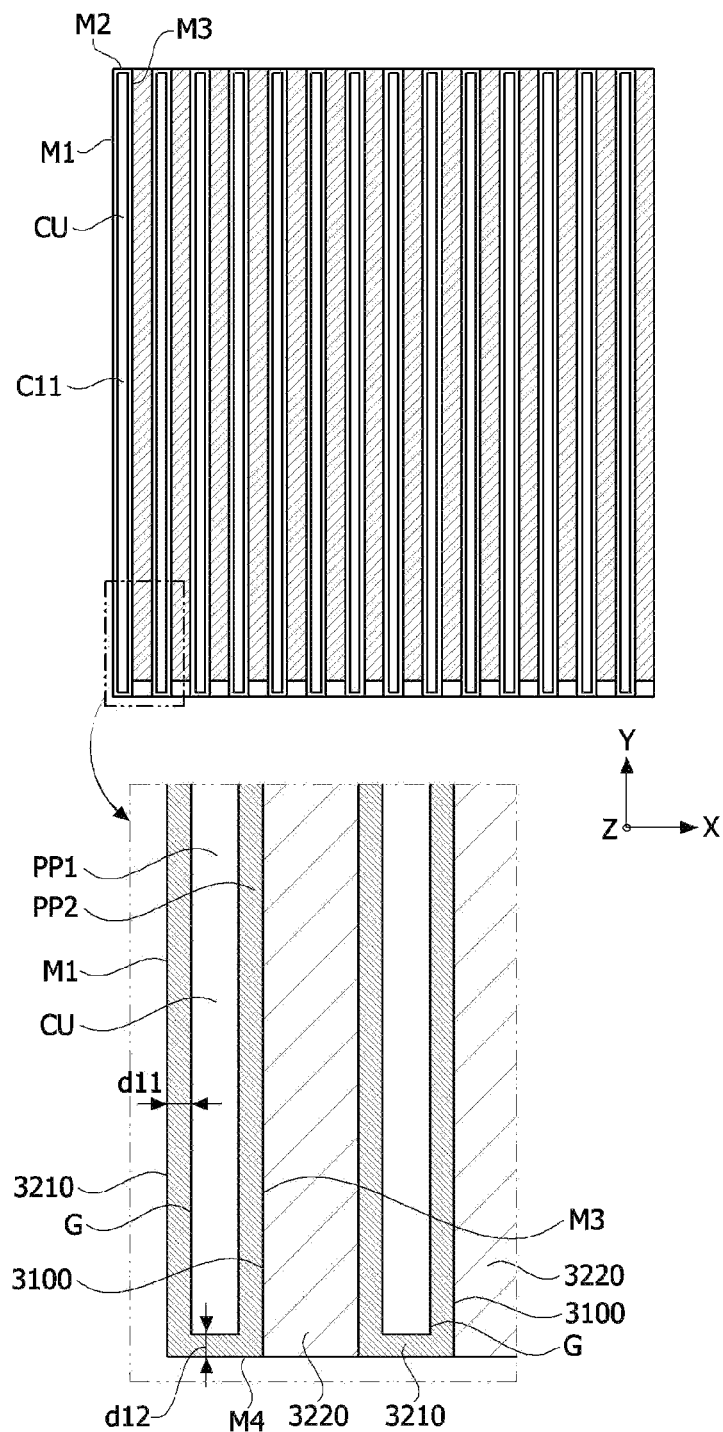

[FIG. 30]
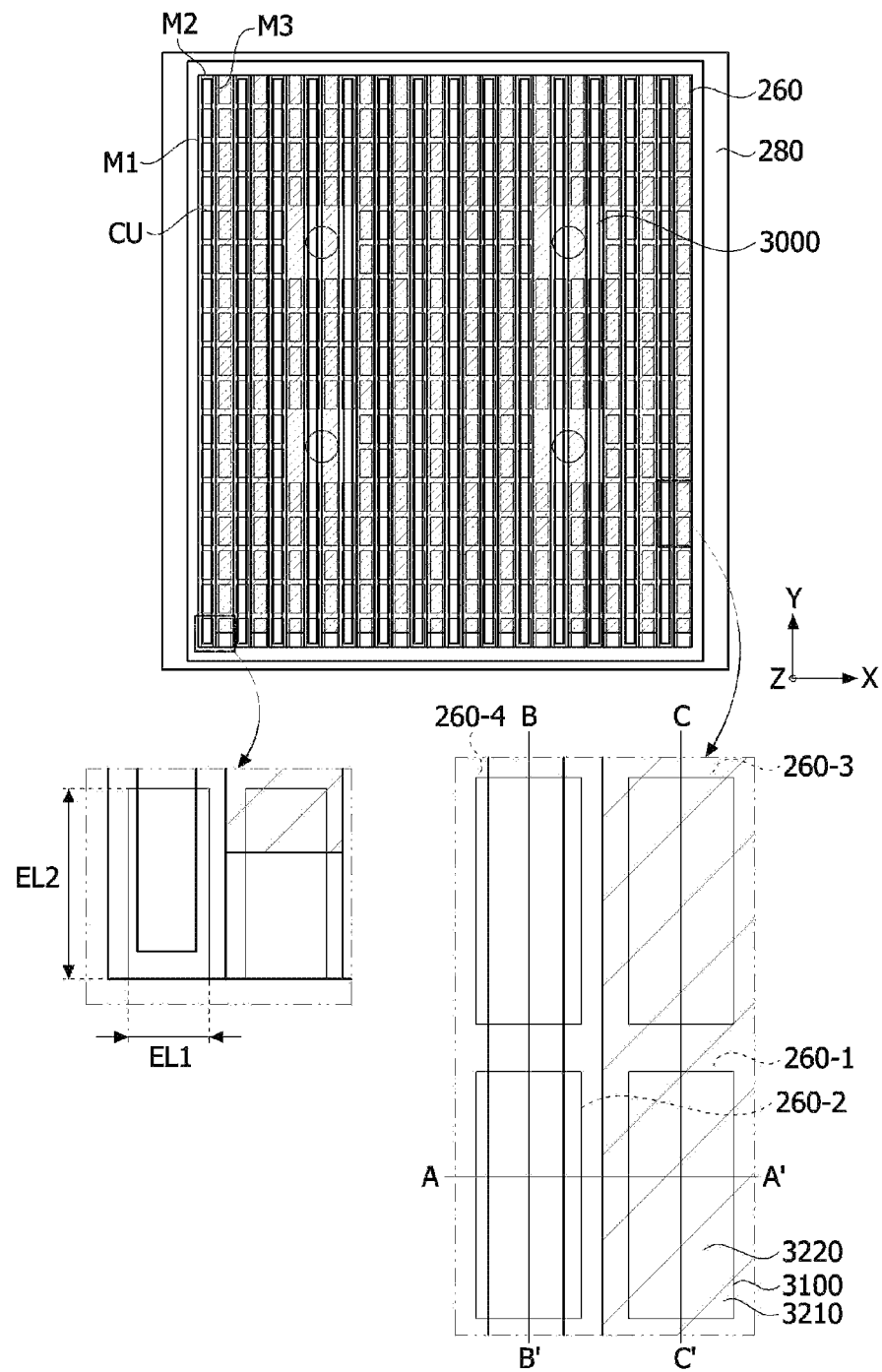

[FIG. 31]
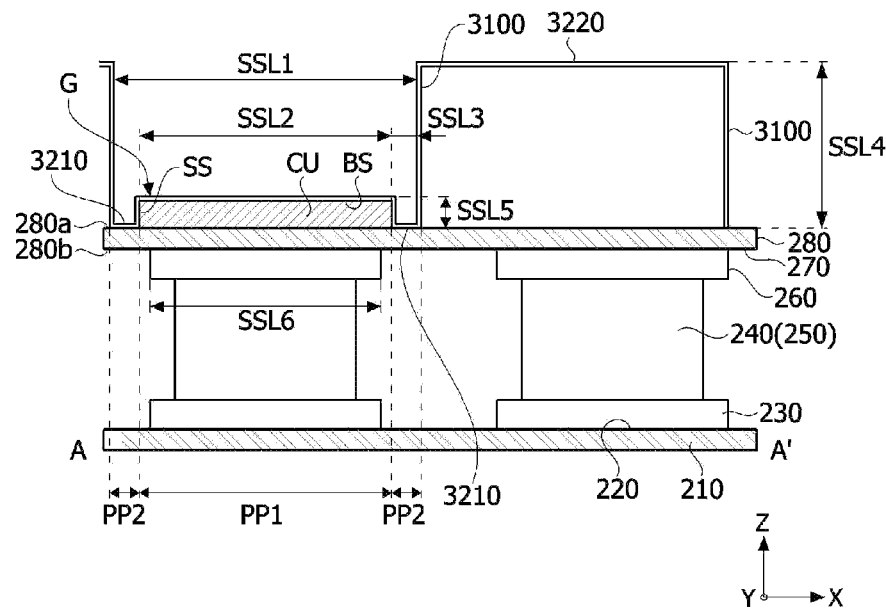
[FIG. 32]
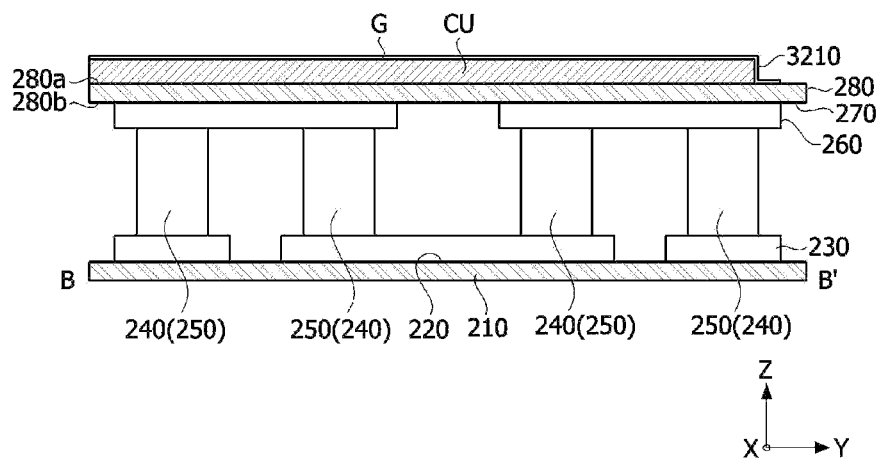

[FIG. 33]
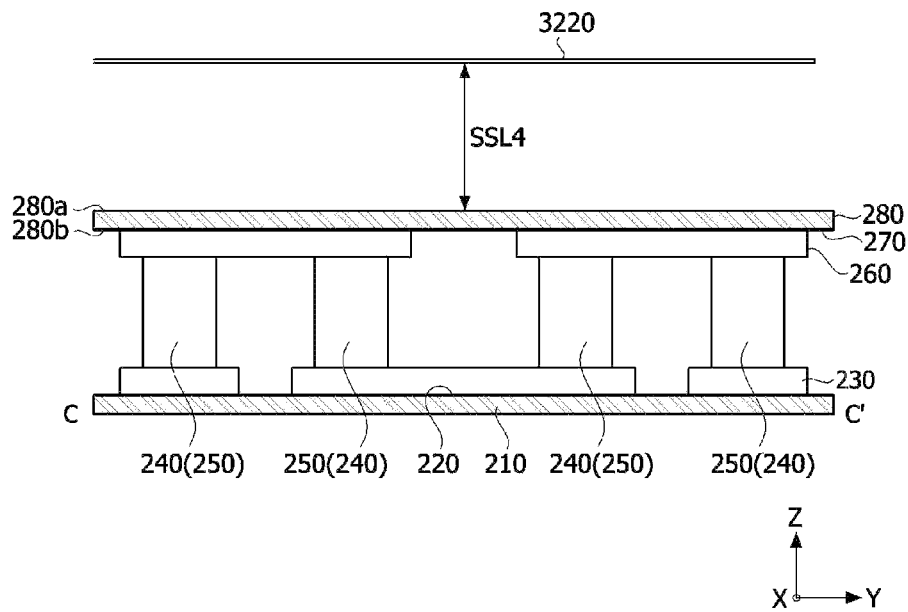
[FIG. 34]
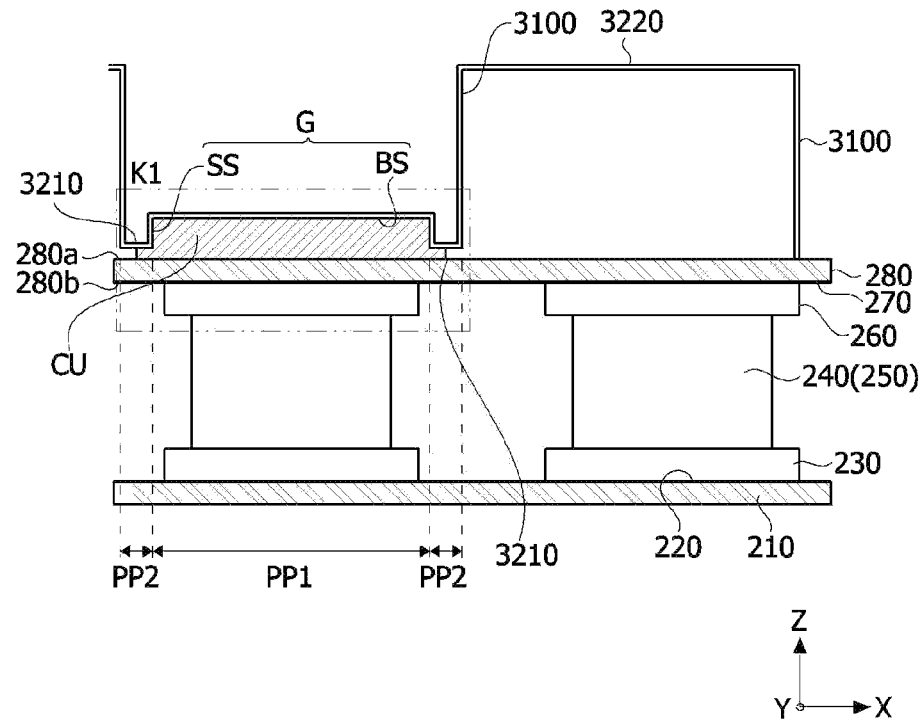

[FIG. 35]
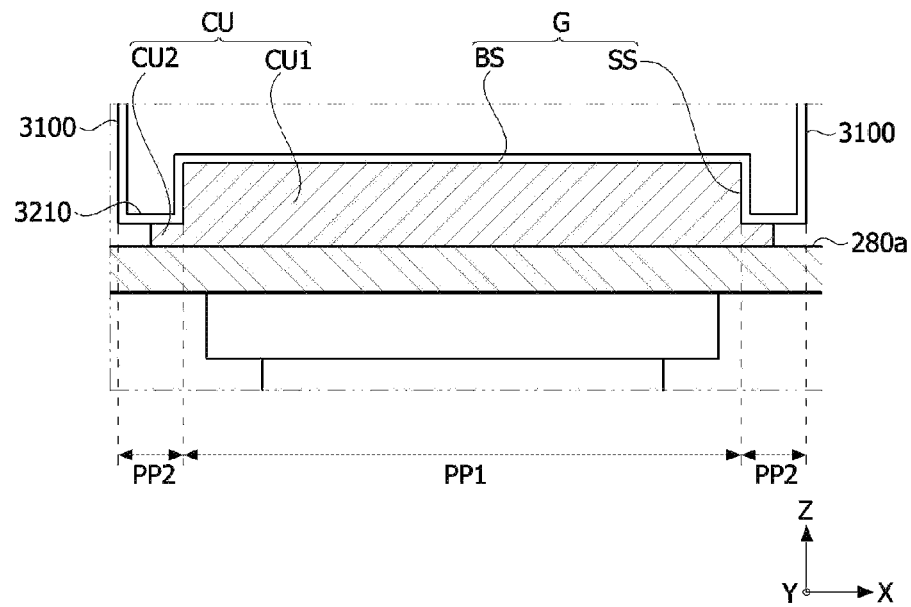
[FIG. 36]
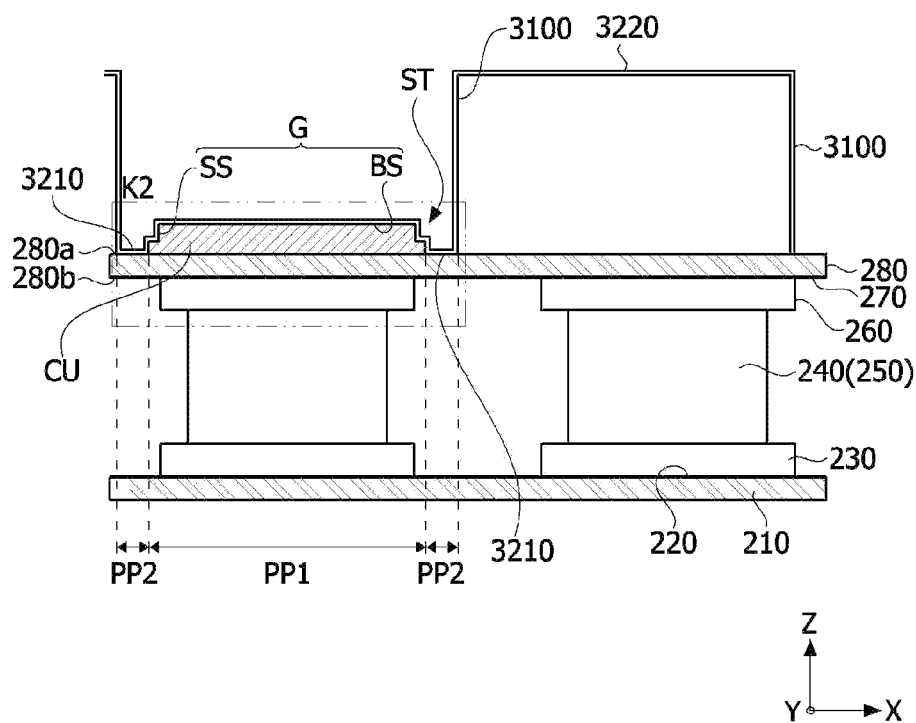

[FIG. 37]
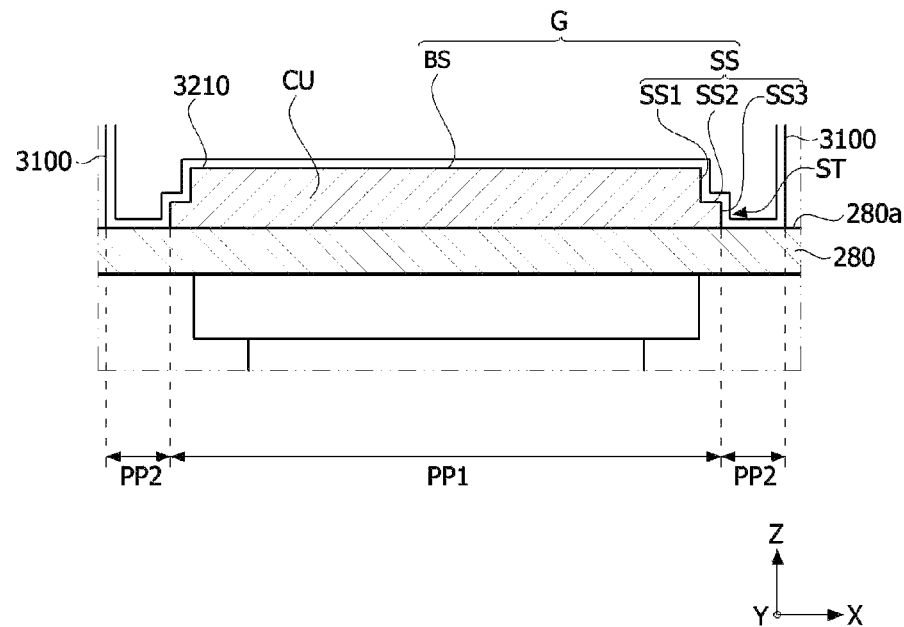
[FIG. 38A]
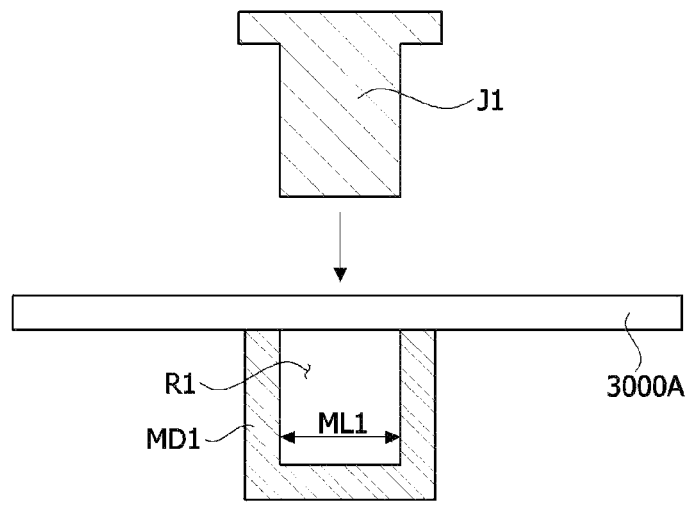
[FIG. 38B]
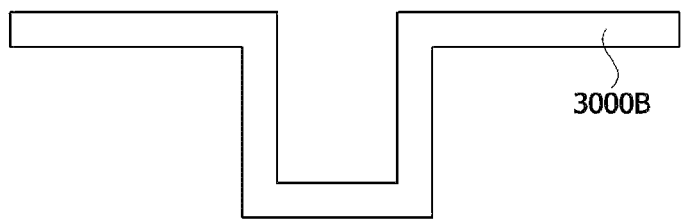

[FIG. 38C]
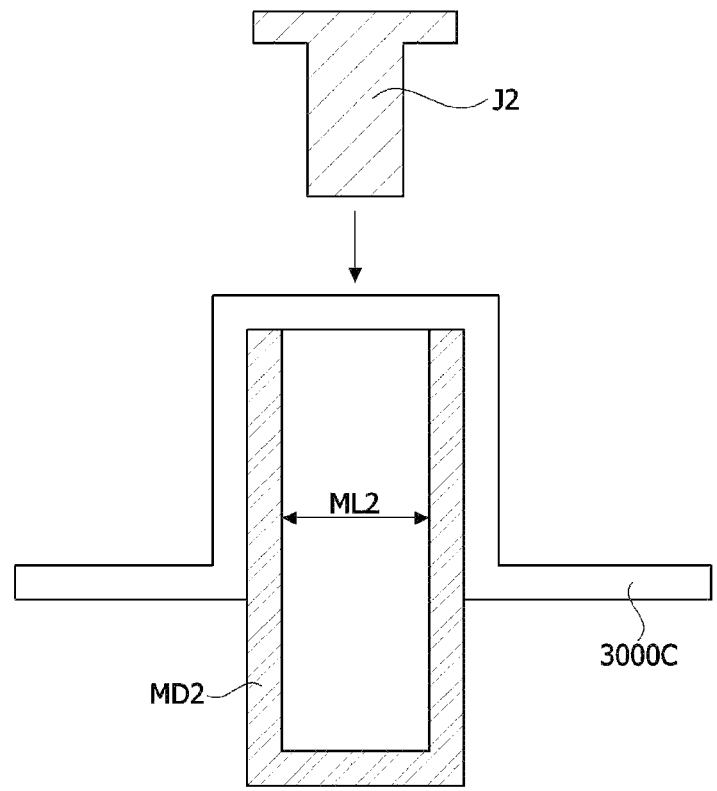
[FIG. 38D]
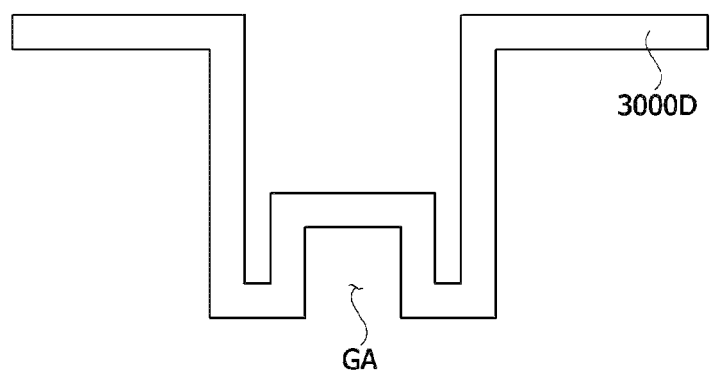

THERMOELECTRIC DEVICE

CROSS REFERENCE TO RELATED APPLICATIONS

This application is the National Phase of PCT International Application No. PCT/KR2021/002553, filed on Mar. 2, 2021, which claims priority under 35 U.S.C. § 119(a) to Patent Application Nos. 10-2020-0035163, filed in Republic of Korea on Mar. 23, 2020 and 10-2020-0036425, filed in Republic of Korea on Mar. 25, 2020, all of which are hereby expressly incorporated by reference into the present application.

TECHNICAL FIELD

The present invention relates to a thermoelectric device, and more specifically, to a structure of a thermoelectric element and a heat sink connected to the thermoelectric element.

BACKGROUND ART

A thermoelectric phenomenon is a phenomenon that occurs by the movement of electrons and holes inside a material, and refers to direct energy conversion between heat and electricity.

A thermoelectric element is a generic term for an element using the thermoelectric phenomenon, and has a structure in which a P-type thermoelectric material and an N-type thermoelectric material are bonded between metal electrodes to form a PN junction pair.

The thermoelectric element may be classified into an element using a temperature change in electrical resistance, an element using a Seebeck effect which is a phenomenon in which an electromotive force is generated by a temperature difference, an element using a Peltier effect which is a phenomenon in which heat absorption or heat generation due to a current occurs, and the like.

The thermoelectric elements are variously applied to home appliances, electronic parts, communication parts, and the like. For example, the thermoelectric elements may be applied to cooling devices, heating devices, power generation devices, and the like. Accordingly, the demand for the thermoelectric performance of the thermoelectric element is gradually increasing.

In addition, the thermoelectric element may be used by being coupled to a heat exchange member for heat exchange. At this time, there is a problem in that heat efficiency is decreased due to the coupling between the heat exchange member and the thermoelectric element and damage due to a differential pressure occurs.

In addition, the thermoelectric element may be used by being coupled to the heat exchange member for heat exchange. At this time, there is a problem in that a coupling force between the heat exchange member and the thermoelectric element by a coupling member or the like is lowered and reliability is decreased.

TECHNICAL PROBLEM

The present invention is directed to providing a structure of a heat sink connected to a thermoelectric element.

Technical Solution

A thermoelectric device according to one embodiment of the present invention includes a thermoelectric element including a first substrate, a plurality of first electrodes disposed on the first substrate, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, and a second substrate disposed on the plurality of second electrodes, and a heat sink including a plurality of fins disposed to be spaced apart from each other on the second substrate, wherein the second substrate includes a first region which overlaps the second electrode in a vertical direction, and a second region which does not overlap the second electrode in the vertical direction, and the plurality of fins have different separation distances between adjacent fins in the first region and the second region.

The separation distance may be greater in the second region than in the first region.

The second substrate may include a lower surface and an upper surface facing the lower surface, and the second electrode may be disposed on the lower surface, and the upper surface may come into contact with the plurality of fins.

The heat sink may include a connection member configured to connect the plurality of fins.

The connection member may include a first connection member coming into contact with the upper surface and a second connection member facing the first connection member.

The plurality of fins may have one ends connected to the first connection member and the other ends connected to the second connection member.

A length of the second connection member may be greater in the second region than in the first region.

The second region may overlap the second connection member in the vertical direction.

A first length of the second electrode in a first direction may be smaller than a second length of the second electrode in a second direction perpendicular to the first direction, the vertical direction may be a direction from the first substrate toward the second substrate, and the first direction and the second direction may be perpendicular to each other and directions perpendicular to the vertical direction.

The first region and the second region may be alternately disposed in the first direction and the second direction.

A thermoelectric device according to one embodiment of the present invention includes a thermoelectric element, a heat sink disposed on the thermoelectric element, and a bonding member disposed between the thermoelectric element and the heat sink, wherein the heat sink includes a groove disposed on a surface which comes into contact with the thermoelectric element, and the bonding member is seated in the groove.

The thermoelectric device may include a lower member which comes into contact with the thermoelectric element, an extension member connected to the lower member, and an upper member connected to the extension member and disposed to be spaced apart from the lower member, wherein the groove may be positioned on the lower member.

The groove may include a side surface, and a bottom surface connected to the side surface and disposed between the lower member and the upper member.

The side surface may include a stepped portion, and a width of the bottom surface may be smaller than a maximum width of the side surface.

A separation distance between the extension members and a separation distance between the side surface and the extension member may be 1:0.05 to 1:0.1.

The thermoelectric element may include a first substrate, a plurality of first electrodes disposed on the first substrate, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, and a second substrate disposed on the plurality of second electrodes.

The groove may at least partially overlap the second electrode in a vertical direction.

The lower member may include a first member region which overlaps the groove in the vertical direction and a second member region disposed outside the groove, and the bonding member may extend between the second member region and the thermoelectric element.

The lower member may be disposed to be spaced apart from the thermoelectric element.

The groove may protrude from the lower member toward the lower member, and the bonding member may be disposed between adjacent extension members under the lower member.

Advantageous Effects

According to an embodiment of the present invention, it is possible to obtain a thermoelectric device having excellent heat efficiency and high reliability.

Specifically, according to an embodiment of the present invention, it is possible to provide a thermoelectric device that improves heat efficiency through a heat sink through a positional relationship between the heat sink and a thermoelectric element of the thermoelectric device and prevents the generation of differential pressure due to a change in a shape of the heat sink.

In addition, according to an embodiment of the present invention, it is possible to provide a thermoelectric device that improves reliability of the thermoelectric device through a structural form for the coupling between the heat sink and the thermoelectric element of the thermoelectric device by a bonding member and prevents an increase in differential pressure due to a change in a shape of the heat sink.

In addition, a thermoelectric element according to an embodiment of the present invention can also be applied not only to applications implemented in a small size, but also applications implemented in a large size such as vehicles, ships, steel mills, and incinerators.

DESCRIPTION OF DRAWINGS

FIG. 1 is a perspective view of a power generation module included in a power generation device according to one embodiment of the present invention.

FIG. 2 is an exploded perspective view of the power generation module according to one embodiment of the present invention.

FIGS. 3 and 4 are partially enlarged views of the power generation module according to one embodiment of the present invention.

FIG. 5 is a plan view of the power generation device according to one embodiment of the present invention.

FIG. 6 is a cross-sectional view of a thermoelectric element included in the power generation module according to one embodiment of the present invention.

FIG. 7 is a perspective view of the thermoelectric element included in the power generation module according to one embodiment of the present invention.

FIG. 8 is a perspective view of the thermoelectric device in which a heat sink is disposed on the thermoelectric device according to one embodiment of the present invention.

FIG. 9 is a plan view of an upper substrate and an upper electrode included in the thermoelectric element according to one embodiment of the present invention.

FIG. 10 is a plan view showing a lower substrate and a lower electrode included in the thermoelectric element according to one embodiment of the present invention.

FIG. 11 is a perspective view of a thermoelectric device including a thermoelectric element and a heat sink according to a first embodiment of the present invention.

FIG. 12 is a plan view showing components of the thermoelectric device according to the first embodiment.

FIG. 13 is a cross-sectional view taken along line A-A' in FIG. 12.

FIG. 14 is a cross-sectional view taken along line B-B' in FIG. 12.

FIG. 15 is a cross-sectional view taken along line C-C' in FIG. 12.

FIG. 16 is a modified example of FIG. 12.

FIG. 17 is another modified example of FIG. 12.

FIG. 18 is a perspective view of a thermoelectric device including a thermoelectric element and a heat sink according to a second embodiment of the present invention.

FIG. 19 is a plan view showing components of the thermoelectric device according to the second embodiment.

FIG. 20 is a cross-sectional view taken along line D-D' in FIG. 19.

FIG. 21 is a cross-sectional view taken along line E-E' in FIG. 19.

FIG. 22 is a cross-sectional view taken along line F-F' in FIG. 19.

FIG. 23 is a perspective view of a thermoelectric device including a thermoelectric element and a heat sink according to a third embodiment of the present invention.

FIG. 24 is a plan view showing components of the thermoelectric device according to the third embodiment.

FIG. 25 is a cross-sectional view taken along line I-I' in FIG. 24.

FIG. 26 is a cross-sectional view taken along line J-J' in FIG. 24.

FIG. 27 is a perspective view of a thermoelectric device including a thermoelectric element and a heat sink according to a fourth embodiment of the present invention.

FIG. 28 is a perspective view showing the heat sink and a bonding member of the thermoelectric device according to the fourth embodiment.

FIG. 29 is a bottom view of the heat sink and the bonding member of the thermoelectric device according to the fourth embodiment.

FIG. 30 is a plan view showing components of the thermoelectric device according to the fourth embodiment.

FIG. 31 is a cross-sectional view taken along line A-A' in FIG. 30.

FIG. 32 is a cross-sectional view taken along line B-B' in FIG. 30.

FIG. 33 is a cross-sectional view taken along line C-C' in FIG. 30.

FIG. 34 is a cross-sectional view of a thermoelectric device according to a fifth embodiment.

FIG. 35 is an enlarged view of portion K1 in FIG. 34.

FIG. 36 is a cross-sectional view of a thermoelectric device according to a sixth embodiment.

FIG. 37 is an enlarged view of portion K2 in FIG. 36.

FIGS. 38A to 38D are flowcharts showing a method of manufacturing the heat sink of the thermoelectric device according to the fourth embodiment.

MODES OF THE INVENTION

Hereinafter, exemplary embodiments of the present invention will be described in detail with reference to the accompanying drawings.

However, the technical spirit of the present invention is not limited to some embodiments described but may be implemented in various different forms, and one or more of the components may be used by being selectively coupled or substituted between the embodiments without departing from the technical spirit scope of the present invention.

In addition, terms (including technical and scientific terms) used in the embodiments of the present invention may be construed as the meaning that may be generally understood by those skilled in the art to which the present invention pertains, unless specifically defined and described explicitly, and the meaning of generally used terms such as terms defined in the dictionary may be construed in consideration of the contextual meaning of the related art.

In addition, the terms used in the embodiments of the present invention are intended to describe the embodiments and are not intended to limit the present invention.

In this specification, the singular form may also include the plural form unless otherwise specified in the phrase, and when it is described as "at least one (or one or more) of A and B, C," it may include one or more of all possible combinations of A, B, and C.

In addition, in describing the components of the embodiment of the present invention, terms such as first, second, A, B, (a), and (b) may be used.

These terms are only intended to distinguish the component from other components, and the essence, sequence, or order of the corresponding components is not limited by the terms.

In addition, when it is described that a component is "connected," "coupled," or "joined" to another component, this may include a case in which the component is not only directly connected, coupled, or connected to another component, but also a case in which the component is "connected," "coupled," or "joined" to another component through other components interposed therebetween.

In addition, when it is described as being formed or disposed on "top (above) or bottom (below)" of each component, the top (above) or bottom (below) includes not only a case in which two components come into direct contact with each other but also a case in which one or more other components are formed or disposed between the two components. In addition, when expressed as "top (above) or bottom (below)," this may also include the meaning of not only an upward direction but also a downward direction with respect to one component.

FIG. 1 is a perspective view of a power generation module included in a power generation device according to one embodiment of the present invention, FIG. 2 is an exploded perspective view of the power generation module according to one embodiment of the present invention, FIGS. 3 and 4 are partially enlarged views of the power generation module according to one embodiment of the present invention, FIG. 5 is a plan view of the power generation device according to one embodiment of the present invention, and FIGS. 6 and 7 are a cross-sectional view and a perspective view of a thermoelectric element included in the power generation module according to one embodiment of the present invention.

First, the thermoelectric device according to the present invention may be used in a power generation device, a power generation system composed of the power generation device, or the like. For example, the power generation system includes a power generation device and a fluid pipe, and a fluid introduced into the fluid pipe may be a heat source generated in an engine of a vehicle or a ship, or a power plant, a steel mill, or the like. However, the present invention is not limited thereto. In addition, a temperature of a fluid discharged from the fluid pipe is lower than a temperature of the fluid introduced into the fluid pipe. For example, the temperature of the fluid introduced into the fluid pipe may be 100° C. or more, preferably, 200° C. or more, and more preferably, 220° C. to 250° C., but is not limited thereto, and may be variously applied according to a temperature difference between a low-temperature portion and a high-temperature portion of the thermoelectric element.

In addition, the power generation device may be disposed adjacent to the fluid pipe to perform power generation using energy of the fluid.

Referring to FIGS. 1 to 4, a power generation device 1000 according to an embodiment of the present invention includes a duct 1100, a first thermoelectric device 1200, a second thermoelectric device 1300, a branching unit 1400, a separation member 1500, a shield member 1600, and a heat-insulating member 1700. In addition, the power generation device 1000 according to the embodiment of the present invention further includes a guide plate 1800 and a support frame 1900.

The duct 1100, the first thermoelectric device 1200, the second thermoelectric device 1300, the branching unit 1400, the separation member 1500, the shield member 1600, and the heat-insulating member 1700 may be assembled into one module, and this may be referred to as a power generation module in this specification.

The power generation device 1000 according to the embodiment of the present invention may generate power using a temperature difference between a first fluid flowing through the inside of the duct 1100 and a second fluid passing through heat sinks 1220 and 1320 of the first thermoelectric device 1200 and the second thermoelectric device 1300 disposed outside the duct 1100.

In this specification, a temperature of the first fluid flowing through the inside of the duct 1100 may be lower than a temperature of the second fluid passing through the heat sinks 1220 and 1320 of the thermoelectric devices 1200 and 1300 disposed outside the duct 1100. In this specification, the first fluid may be a cooling coolant, and the second fluid may be a high-temperature gas. To this end, the first thermoelectric device 1200 may be disposed on one surface of the duct 1100, and the second thermoelectric device 1300 may be disposed on the other surface of the duct 1100. At this time, a face disposed to face the duct 1100 of both faces of each of the first thermoelectric device 1200 and the second thermoelectric device 1300 is the low-temperature portion, and power may be generated using a temperature difference between the low-temperature portion and the high-temperature portion. Accordingly, in this specification, the duct 1100 may be referred to as a cooling unit.

The first fluid introduced into the duct 1100 may be water, but is not limited thereto, and may be various types of fluids having cooling performance. A temperature of the first fluid introduced into the duct 1100 may be smaller than 100° C., preferably, smaller than 50° C., and more preferably, smaller than 40° C., but is not limited thereto. A temperature of the first fluid discharged after passing through the duct 1100 may be higher than the temperature of the first fluid introduced into the duct 1100. Each duct 1100 includes a first surface 1110, a second surface 1120 facing the first surface 1110 and disposed parallel to the first surface 1110, a third surface 1130 disposed between the first surface 1110 and the second surface 1120, a fourth surface 1140 disposed perpendicular to the third surface 1130 between the first surface 1110 and the second surface 1120, a fifth surface 1150 disposed to face the third surface 1130, and a sixth surface 1160 disposed to face the fourth surface 1140, and the first fluid passes through the inside of the duct. When the first thermoelectric device 1200 and the second thermoelectric device 1300 are disposed on the first surface 1110 and the second surface 1120 of the duct 1100, respectively, the third surface 1130 may be a surface disposed in a direction in which the second fluid is introduced, and the fourth surface 1140 may be a surface disposed in directions in which the first fluid is introduced and discharged. To this end, a first fluid inlet 1142 and a first fluid outlet 1144 may be formed on the fourth surface 1140 of the duct 1100. The first fluid inlet 1142 and the first fluid outlet 1144 may be connected to a fluid passage pipe in the duct 1100. Accordingly, the first fluid introduced from the first fluid inlet 1142 may be discharged from the first fluid outlet 1144 after passing through the fluid passage pipe.

Although not shown, a heat-dissipation fin may be disposed on an inner wall of the duct 1100. The shape, number, and area occupying the inner wall of the duct 1100 of the heat-dissipation fin may be variously changed depending on the temperature of the first fluid, a temperature of waste heat, a required power generation capacity, and the like. The area at which the heat-dissipation fin occupies the inner wall of the duct 1100 may be, for example, 1 to 40% of a cross-sectional area of the duct 1100. Accordingly, it is possible to obtain high thermoelectric conversion efficiency even without interfering with the flow of the first fluid. At this time, the heat-dissipation fin may have a shape that does not interfere with the flow of the first fluid. For example, the heat-dissipation fin may be formed in a direction in which the first fluid flows. In other words, the heat-dissipation fin may have a plate shape extending from the first fluid inlet toward the first fluid outlet, and a plurality of heat-dissipation fins may be disposed to be spaced apart from each other by a predetermined interval. The heat-dissipation fin may also be integrally formed with the inner wall of the duct 1100.

According to the embodiment of the present invention, a direction of the second fluid flowing through a fluid passage unit 2200 and the directions in which the first fluid flowing through the duct 1100 is introduced and discharged may be different from each other. For example, the directions in which the first fluid is introduced and discharged and the direction in which the second fluid passes may be different from each other by about 90°. Accordingly, it is possible to obtain uniform heat conversion performance in the entire region. Meanwhile, the first thermoelectric device 1200 may be disposed on the first surface 1110 of the duct 1100, and the second thermoelectric device 1300 may be disposed to be symmetrical to the first thermoelectric device 1200 on the second surface 1120 of the duct 1100.

The first thermoelectric device 1200 and the second thermoelectric device 1300 may be fastened to the duct 1100 using a screw or a coil spring. Accordingly, the first thermoelectric device 1200 and the second thermoelectric device 1300 may be stably coupled to the surface of the duct 1100. Alternatively, at least one of the first thermoelectric device 1200 and the second thermoelectric device 1300 may also be bonded to the surface of the duct 1100 using a thermal interface material (TIM). By using the coil spring and/or the TIM and/or the screw, the uniformity of heat applied to the first thermoelectric device 1200 and the second thermoelectric device 1300 may be uniformly controlled even at a high temperature.

Meanwhile, as shown in FIG. 3, each of the first thermoelectric device 1200 and the second thermoelectric device 1300 includes thermoelectric elements 1210 and 1310 disposed on the first surface 1110 and the second surface 1120, respectively and the heat sinks 1220 and 1320 disposed on the thermoelectric elements 1210 and 1310, respectively. As described above, the duct 1100 through which the first fluid flows is disposed on one face of both faces of each of the thermoelectric elements 1210 and 1310, and the heat sinks 1220 and 1320 are disposed on the other face thereof, and when the second fluid passes through the heat sinks 1220 and 1320, a temperature difference between a heat-absorption face and a heat-dissipation face of the thermoelectric elements 1210 and 1310 may be increased, thereby increasing thermoelectric conversion efficiency. At this time, when a direction from the first surface 1110 toward the thermoelectric element 1210 and the heat sink 1220 is defined as a first direction, a length of the first direction of the heat sink 1220 may be greater than a length of the first direction of the thermoelectric element 1210. Accordingly, since a contact area between the second fluid and the heat sink 1220 is increased, the temperature of the heat-absorption face of the thermoelectric element 1210 may be increased. The heat sink may perform heat-absorption/heat-reception.

Referring to FIG. 4, the heat sinks 1220 and 1320 and the thermoelectric elements 1210 and 1310 may be fastened by a plurality of fastening members 1230 and 1330. Here, the fastening members 1230 and 1330 may be a coil spring or a screw. To this end, at least some of the heat sinks 1220 and 1320 and the thermoelectric elements 1210 and 1310 may be formed with through-holes S through which the fastening members 1230 and 1330 pass. Here, separate insulators 1240 and 1340 may be further disposed between the through-holes S and the fastening members 1230 and 1330. The separate insulators 1240 and 1340 may be insulators surrounding outer circumferential surfaces of the fastening members 1230 and 1330 or insulators surrounding wall surfaces of the through holes S. For example, the insulators 1240 and 1340 may have a ring shape. Inner circumferential surfaces of the insulators 1240 and 1340 having a ring shape may be disposed on the outer circumferential surfaces of the fastening members 1230 and 1330, and outer circumferential surfaces of the insulators 1240 and 1340 may be disposed on inner circumferential surfaces of the through-holes S. Accordingly, the fastening members 1230 and 1330, the heat sinks 1220 and 1320, and the thermoelectric elements 1210 and 1310 may be insulated therebetween.

At this time, structures of the thermoelectric elements 1210 and 1310 may have a structure of the thermoelectric element 100 shown in FIGS. 6 and 7.

Referring to FIGS. 6 and 7, the thermoelectric element 100 includes a lower substrate 110, a lower electrode 120, a P-type thermoelectric leg 130, an N-type thermoelectric leg 140, an upper electrode 150, and an upper substrate 160.

The lower electrodes 120 are disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are electrically connected by the lower electrodes 120 and the upper electrode 150. A pair of P-type thermoelectric legs 130 and N-type thermoelectric legs 140 disposed between the lower electrodes 120 and the upper electrode 150 and electrically connected may form a unit cell.

For example, when a voltage is applied to the lower electrode 120 and the upper electrode 150 through lead wires 181 and 182, a substrate through which a current flows from the P-type thermoelectric leg 130 to the N-type thermoelectric leg 140 may function as a cooling unit by absorbing heat due to a Peltier effect, and a substrate through which a current flows from the N-type thermoelectric leg 140 to the P-type thermoelectric leg 130 may function as a heating unit by being heated due to a Peltier effect. Alternatively, when a temperature difference between the lower electrode 120 and the upper electrode 150 is applied, charges in the P-type thermoelectric leg 130 and the N-type thermoelectric leg 140 may move due to a Seebeck effect, and electricity may also be generated.

Here, each of the P-type thermoelectric leg 130 and the N-type thermoelectric leg 140 may be a bismuth telluride (Bi—Te)-based thermoelectric leg containing bismuth (Bi) and tellurium (Te) as a main raw material. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain Bi—Sb—Te, which is a main raw material, in an amount of 99 to 99.999 wt % based on 100 wt % of the total weight, and contain at least one of nickel (Ni), aluminum (Al), copper (Cu), silver (Ag), lead (Pb), boron (B), gallium (Ga), and indium (In) in an amount of 0.001 to 1 wt % based on 100 wt % of the total weight. The N-type thermoelectric leg 140 may be a bismuth telluride (Bi—Te)-based thermoelectric leg containing at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain Bi—Se—Te, which is a main raw material, in an amount of 99 to 99.999 wt % based on 100 wt % of the total weight, and contain at least one of nickel (Ni), aluminum (Al), copper (Cu), silver (Ag), lead (Pb), boron (B), gallium (Ga), and indium (In) in an amount of 0.001 to 1 wt % based on 100 wt % of the total weight.

The P-type thermoelectric leg 130 and the N-type thermoelectric leg 140 may be formed in a bulk type or a stack type. In general, the bulk-type P-type thermoelectric leg 130 or the bulk-type N-type thermoelectric leg 140 may be obtained through a process of heat-treating a thermoelectric material to manufacture an ingot, grinding and sieving the ingot to acquire thermoelectric leg powder, and then sintering the thermoelectric leg powder, and cutting a sintered body. At this time, the P-type thermoelectric leg 130 and the N-type thermoelectric leg 140 may be a polycrystalline thermoelectric leg. As described above, when the P-type thermoelectric leg 130 and the N-type thermoelectric leg 140 are a polycrystalline thermoelectric leg, strengths of the P-type thermoelectric leg 130 and the N-type thermoelectric leg 140 may be increased. The stack-type P-type thermoelectric leg 130 or the stack-type N-type thermoelectric leg 140 may be obtained through a process of applying a paste containing a thermoelectric material to a sheet-shaped substrate to form a unit member, and then stacking and cutting the unit member.

At this time, the pair of P-type thermoelectric legs 130 and N-type thermoelectric legs 140 may have the same shape and volume, or may have different shapes and volumes. For example, since electrical conductivity characteristics of the P-type thermoelectric leg 130 and the N-type thermoelectric leg 140 are different from each other, a height or cross-sectional area of the N-type thermoelectric leg 140 may also be formed differently from a height or cross-sectional area of the P-type thermoelectric leg 130.

At this time, the P-type thermoelectric leg 130 or the N-type thermoelectric leg 140 may have a cylindrical shape, a polygonal column shape, an elliptical column shape, or the like.

The performance of the thermoelectric element according to one embodiment of the present invention may be expressed as a figure of merit (ZT). The figure of merit (ZT) may be expressed as in Equation 1:

$$ZT = \alpha^2 \cdot \sigma \cdot T/k \qquad \text{[Equation 1]}$$

where $\alpha$ refers to a Seebeck coefficient [V/K], $\sigma$ refers to an electrical conductivity [S/m], and $\alpha^2\sigma$ refers to a power factor [W/mK2]. In addition, T refers to a temperature, and k refers to a thermal conductivity [W/mK]. k may be expressed as $a \cdot cp \cdot \rho$, wherein a refers to a thermal diffusivity [cm2/S], cp refers to a specific heat [J/gK], and $\rho$ refers to a density [g/cm3].

In order to obtain the figure of merit of the thermoelectric element, a Z value (V/K) may be measured using a Z meter, and the figure of merit (ZT) may be calculated using the measured Z value.

Here, the lower electrode 120 disposed between the lower substrate 110, the P-type thermoelectric leg 130, and the N-type thermoelectric leg 140 and the upper electrode 150 disposed between the upper substrate 160, the P-type thermoelectric leg 130, and the N-type thermoelectric leg 140 may include at least one of copper (Cu), silver (Ag), aluminum (Al), and nickel (Ni), and have a thickness of 0.01 mm to 0.3 mm. When a thickness of the lower electrode 120 or the upper electrode 150 is smaller than 0.01 mm, a function as an electrode may be degraded, thereby lowering electrical conduction performance, and when the thickness of the lower electrode 120 or the upper electrode 150 exceeds 0.3 mm, conduction efficiency may be lowered due to an increase in resistance.

In addition, the lower substrate 110 and the upper substrate 160 facing each other may be metal substrates, and thicknesses thereof may be 0.1 mm to 1.5 mm. When the thickness of the metal substrate is smaller than 0.1 mm or exceeds 1.5 mm, heat-dissipation characteristics or thermal conductivity may be excessively increased, and thus reliability of the thermoelectric element may be lowered. In addition, when the lower substrate 110 and the upper substrate 160 are the metal substrates, an insulating layer 170 may be further formed between the lower substrate 110 and the lower electrode 120 and between the upper substrate 160 and the upper electrode 150. The insulating layer 170 may include a material having a thermal conductivity of 1 to 20 W/mK. At this time, the insulating layer 170 may be a layer made of a resin composition containing at least one of an epoxy resin and a silicone resin and an inorganic material or made of a silicon composite containing silicon and an inorganic material, or an aluminum oxide layer. Here, the inorganic material may be at least one of oxide, nitride, and carbide of aluminum, boron, silicon, or the like.

At this time, sizes of the lower substrate 110 and the upper substrate 160 may also be formed differently from each other. In other words, a volume, thickness, or area of one of the lower substrate 110 and the upper substrate 160 may be formed to be greater than a volume, thickness, or area of the other thereof. Here, the thickness may be a thickness in a direction from the lower substrate 110 to the upper substrate 160, and the area may be an area in a direction perpendicular to a direction from the substrate 110 to the upper substrate 160. Accordingly, it is possible to improve heat-absorption performance or heat-dissipation performance of the thermoelectric element. Preferably, the volume, thickness, or area of the lower substrate 110 may be formed to be greater than at least one of the volume, thickness, or area of the upper substrate 160. At this time, when the lower substrate 110 is disposed in a high-temperature region for the Seebeck effect, when the lower substrate 110 is applied as a heat-generation region for the Peltier effect, or when a sealing member configured to protect the thermoelectric element from external environments of the thermoelectric element to be described below is disposed on the lower substrate 110, at least one of the volume, thickness, or area of the lower substrate 110 may be formed to be greater than that of the upper substrate 160. At this time, the area of the lower substrate 110 may be formed in a range of 1.2 to 5 times the area of the upper substrate 160. The effect on the improvement of heat transfer efficiency is not high when the area of the lower substrate 110 is formed to be smaller than 1.2 times that of the upper substrate 160, the heat transfer efficiency is rather significantly decreased when the area of the lower substrate 110 exceeds 5 times, and it may be difficult to maintain a basic shape of the thermoelectric device.

In addition, a heat-dissipation pattern, for example, an uneven pattern may also be formed on a surface of at least one of the lower substrate 110 and the upper substrate 160. Accordingly, it is possible to improve heat-dissipation performance of the thermoelectric element. When the uneven pattern is formed on a face coming into contact with the P-type thermoelectric leg 130 or the N-type thermoelectric leg 140, it is also possible to improve bonding characteristics between the thermoelectric leg and the substrate. The thermoelectric element 100 includes the lower substrate 110, the lower electrode 120, the P-type thermoelectric leg 130, the N-type thermoelectric leg 140, the upper electrode 150, and the upper substrate 160.

Although not shown, a sealing member may be further disposed between the lower substrate 110 and the upper substrate 160. The sealing member may be disposed on side surfaces of the lower electrode 120, the P-type thermoelectric leg 130, the N-type thermoelectric leg 140, and the upper electrode 150 between the lower substrate 110 and the upper substrate 160. Accordingly, the lower electrode 120, the P-type thermoelectric leg 130, the N-type thermoelectric leg 140, and the upper electrode 150 may be sealed from external moisture, heat, contamination, and the like.

At this time, the lower substrate 110 disposed on the duct 1100 may be an aluminum substrate, and the aluminum substrate may be bonded to each of the first surface 1110 and the second surface 1120 by the TIM. Since the aluminum substrate has excellent heat transfer performance, heat transfer between one of both faces of the thermoelectric elements 1210 and 1310 and the duct 1100 through which the first fluid flows is easy. In addition, when the aluminum substrate and the duct 1100 through which the first fluid flows are bonded by the TIM, heat transfer between the aluminum substrate and the duct 1100 through which the first fluid flows may not be disturbed. Here, the TIM is a material having heat transfer performance and adhesive performance, and may be, for example, a resin composition containing at least one of an epoxy resin and a silicone resin and an inorganic material. Here, the inorganic material may be oxide, carbide, or nitride of aluminum, boron, silicon, or the like.

Referring to FIG. 5, the separation member 1500 may separate guide plates 1800-1 and 1800-2 from the duct 1100 by a predetermined interval by coming into contact with the guide plates 1800-1 and 1800-2 and the duct 1100. Here, the contact may refer to not only direct contact, but also indirect contact through another medium.

According to the embodiment of the present invention, the separation member 1500 may be disposed between the first surface 1110 and the second surface 1120 of the duct 1100 described above. When the branching unit 1400 is disposed on the third surface 1130 between the first surface 1110 and the second surface 1120 of the duct 1100, the separation member 1500 may be disposed on the fourth surface 1140 disposed to be perpendicular to the third surface 1130 between the first surface 1110 and the second surface 1120 of the duct 1100.

Here, the third surface 1130 on which the branching unit 1400 is disposed may be a surface disposed in a direction in which the second fluid is introduced, and the fourth surface 1140 on which the separation member 1500 is disposed may be a surface disposed in a direction in which the first fluid is introduced.

According to one embodiment of the present invention, the separation member 1500 separates a horizontal distance between the first surface 1110 of the duct 1100 and the first guide plate 1800-1 and a horizontal distance between the second surface 1120 of the duct 1100 and the second guide plate 1800-2 by a predetermined distance. Accordingly, a horizontal distance between the first heat sink 1220 of the first thermoelectric device 1200 and the first guide plate 1800-1 and a horizontal distance between the second heat sink 1320 of the second thermoelectric device 1300 and the guide plates 1800-2 may be spaced apart by a predetermined distance. At this time, the separation member 1500 may include a heat-insulating material. Accordingly, it is possible to heat-insulate between the second fluid flowing along the guide plates 1800-1 and 1800-2 and the first fluid flowing in the duct 1100.

To this end, the separation member 1500 may include an inner region 1510 disposed on the fourth surface 1140 perpendicular to the third surface 1130 of the duct 1100 on which the branching unit 1400 is disposed, a first outer region 1520 extending from the inner region 1510 toward the first surface 1110, and a second outer region 1530 extending from the inner region 1510 toward the second surface 1120. At this time, a first face 1522 of the first outer region 1520 may be disposed on the first surface 1110, and a second face 1524 of the first outer region 1520 may be disposed on the first guide plate 1800-1. In addition, a first face 1532 of the second outer region 1530 may be disposed on the second surface 1120, and a second face 1534 of the second outer region 1530 may be disposed on the second guide plate 1800-2. Accordingly, since the first surface 1110 of the duct 1100 and the first guide plate 1800-1 may be spaced apart from each other by a distance T between the first face 1522 and the second face 1524 of the first outer region 1520, the second surface 1120 of the duct 1100 and the second guide plate 1800-2 may be spaced apart from each other by a distance T between the first face 1532 and the second face 1534 of the second outer region 1530, and the heat sink and the guide plate may maintain a predetermined distance t, it is possible to optimize a pressure difference of the second fluid and a flow space of the second fluid. In this specification, the pressure difference of the second fluid may refer to a pressure difference between the second fluid before and after the second fluid passes through the heat sink of the thermoelectric device. When a length of the heat sink is 1, the sum of the length 1 of the heat sink and the distance t between the heat sink and the guide plate may be equal to the distance T between the first face 1522 and the second face 1524 of a second region of the separation member 1500 or the distance T between the first face 1532 and the second face 1534 of a third region of the separation member 1500, that is, the distance between the duct 1100 and the guide plate 1800.

Referring back to FIGS. 1 to 4, in order to increase sealing and heat-insulation effects between the first thermoelectric device 1200, the duct 1100, and the second thermoelectric device 1300, the heat-insulating member 1700 according to the embodiment of the present invention may be disposed on, for example, a surface excluding a region where the first thermoelectric device 1200 and the second thermoelectric device 1300 are disposed among the surfaces of the duct 1100. Accordingly, it is possible to prevent heat loss of the first fluid and the second fluid, and improve the power generation performance by increasing the temperature difference between the low-temperature portion and the high-temperature portion of each of the first thermoelectric device 1200 and the second thermoelectric device 1300. In addition, the shield member 1600 may be disposed on a surface excluding the region where the first thermoelectric device 1200 and the second thermoelectric device 1300 are disposed among the surfaces of the duct 1100. Wires and connectors connected to the first thermoelectric device 1200 and the second thermoelectric device 1300 may be protected from external moisture or contamination.

Meanwhile, the guide plate 1800 is a plate configured to guide the flow of the second fluid in the fluid passage unit 2200, and the second fluid introduced into the fluid passage unit 2200 may flow along the guide plate 1800 and then may be discharged.

The first guide plate 1800-1 may be disposed to face the first thermoelectric device 1200, the second guide plate 1800-2 may be disposed to face the second thermoelectric device 1300, and the second fluid may pass between the first thermoelectric device 1200 and the first guide plate 1800-1 and between the second thermoelectric device 1300 and the second guide plate 1800-2.

At this time, both sides of the guide plates 1800-1 and 1800-2 may extend to fluid collection plates 1810-1 and 1810-2 and fluid diffusion plates 1820-1 and 1820-2. The fluid collection plates 1810-1 and 1810-2 may refer to plates extending toward an inlet of the fluid passage unit 2200, that is, a first connection unit 2400, and the fluid diffusion plates 1820-1 and 1820-2 may refer to plates extending toward an outlet of the fluid passage unit 2200, that is, a second connection unit 2500. At this time, the fluid collection plates 1810-1 and 1810-2, the guide plates 1800-1 and 1800-2, and the fluid diffusion plates 1820-1 and 1820-2 may be plates integrally connected to one another. The first guide plate 1800-1 disposed to face the first thermoelectric device 1200 and the second guide plate 1800-2 disposed to face the second thermoelectric device 1300 may be disposed symmetrically while maintaining a constant distance d3. Here, the distance d3 between the first guide plate 1800-1 and the second guide plate 1800-2 may be a horizontal distance from the first guide plate 1800-1 toward the second guide plate 1800-2. Accordingly, since the second fluid may pass between the first thermoelectric device 1200 and the first guide plate 1800-1 and between the second thermoelectric device 1300 and the second guide plate 1800-2 at a constant flow rate, it is possible to obtain uniform thermoelectric performance. In contrast, the first fluid collection plate 1810-1 and the second fluid collection plate 1810-2 may be disposed symmetrically so that distances d4 and d4' between the first fluid collection plate 1810-1 extending from the first guide plate 1800-1 and the second fluid collection plate 1810-2 extending from the second guide plate 1800-2 increase as the first fluid collection plate 1810-1 and the second fluid collection plate 1810-2 are closer to the inlet of the fluid passage unit 2200. Here, the distances between the first fluid collection plate 1810-1 and the second fluid collection plate 1810-2 may be horizontal distances from the first fluid collection plate 1810-1 to the second fluid collection plate 1810-2. Likewise, the first fluid diffusion plate 1820-1 and the second fluid diffusion plate 1820-2 may be disposed symmetrically so that distances between the first fluid diffusion plate 1820-1 extending from the first guide plate 1800-1 and the second fluid diffusion plate 1820-2 extending from the second guide plate 1800-2 also increase as the first fluid diffusion plate 1820-1 and the second fluid diffusion plate 1820-2 are closer to the outlet of the fluid passage unit 2200. Accordingly, the second fluid introduced through the inlet of the fluid passage unit 2200 may be collected in the fluid collection plates 1810-1 and 1810-2 and then may pass between the thermoelectric devices 1200 and 1300 and the guide plate 1800, and may be diffused from the fluid diffusion plates 1820-1 and 1820-2 and then discharged through the outlet of the fluid passage unit 2200. Accordingly, it is possible to minimize the pressure difference of the second fluid before and after the second fluid passes between the thermoelectric devices 1200 and 1300 and the guide plate 1800, thereby preventing the second fluid from flowing back toward the inlet of the fluid passage unit 2200.

At this time, the support frame 1900 supports the first and second guide plates 1800-1 and 1800-2, the first and second fluid collection plates 1810-1 and 1810-2, and the first and second fluid diffusion plates 1820-1 and 1820-2. In other words, the support frame 1900 may include a first support frame 1900-1 and a second support frame 1900-2, and the first and second guide plates 1800-1 and 1800-2, the first and second fluid collection plates 1810-1 and 1810-2, and the first and second fluid diffusion plates 1820-1 and 1820-2 may be fixed between the first support frame 1900-1 and the second support frame 1900-2.

Meanwhile, according to the embodiment of the present invention, the branching unit 1400 may branch the second fluid introduced into the fluid passage unit 2200. The second fluid branched by the branching unit 1400 may pass between the first thermoelectric device 1200 and the first guide plate 1800-1 and between the second thermoelectric device 1300 and the second guide plate 1800-2.

The branching unit 1400 may be disposed between the first surface 1110 and the second surface 1120 of the duct 1100. For example, when the third surface 1130 of the duct 1100 is disposed in the direction in which the second fluid is introduced, the branching unit 1400 may be disposed on a side of the third surface 1130 of the duct 1100. Alternatively, the branching unit 1400 may also be disposed on a side of the fifth surface 1150 facing the third surface 1130 of the duct 1100 according to a hydrodynamic principle.

The branching unit 1400 may have a shape in which a distance from the third surface 1130 increases from both ends of the third surface 1130 toward a center between the both ends of the third surface 1130 on the third surface 1130 of the duct 1100. In other words, the third surface 1130 on which the branching unit 1130 is disposed may be substantially perpendicular to the first surface 1110 and the second surface 1120, and the branching unit 1400 may be disposed to be inclined with respect to the first surface 1110 and the second surface 1120 of the duct 1100. For example, the branching unit 1400 may have an umbrella shape or a roof shape. Accordingly, the second fluid, for example waste heat, may be branched through the branching unit 1400 and guided to come into contact with the first thermoelectric device 1200 and the second thermoelectric device 1300 disposed on both surfaces of the power generation device. In other words, the second fluid may be branched through the branching unit 1400 and may pass between the first thermoelectric device 1200 and the first guide plate 1800-1 and between the second thermoelectric device 1300 and the second guide plate 1800-2.

Meanwhile, a width W1 between the outside of the first heat sink 1220 of the first thermoelectric device 1200 and the outside of the second heat sink 1320 of the second thermoelectric device 1300 may be greater than a width W2 of the branching unit 1400. Here, each of the outside of the first heat sink 1220 and the outside of the second heat sink 1320 may refer to an opposite side of the side facing the duct 1100. Here, each of the first heat sink 1220 and the second heat sink 1320 may include a plurality of heat-dissipation fins, and the plurality of heat-dissipation fins may be formed in a direction in which the flow of the gas is not disturbed. For example, the plurality of heat-dissipation fins may have a plate shape extending in a second direction in which the gas flows. Alternatively, the plurality of heat-dissipation fins may have a shape folded so that a flow path is formed in the second direction in which the gas flows. At this time, a maximum width W1 between the first heat sink 1220 of the first thermoelectric device 1200 and the second heat sink 1320 of the second thermoelectric device 1300 may refer to a distance from the furthest point of the heat sink 1220 to the farthest point of the second heat sink 1320 with respect to the duct 1100, and a maximum width W2 of the branching unit 1400 may refer to a width of the branching unit 1400 in a region closest to the third surface 1130 of the duct 1100. Accordingly, the flow of the second fluid may be directly transmitted to the first heat sink 1220 and the second heat sink 1320 without being disturbed by the branching unit 1400. Accordingly, contact areas between the second fluid, and the first heat sink 1220 and the second heat sink 1320 may be increased, thereby increasing an amount of heat received by the first heat sink 1220 and the second heat sink 1320 from the second fluid and increasing power generation efficiency.

Meanwhile, the first guide plate 1800-1 may be symmetrically disposed to be spaced apart from the first heat sink 1220 of the first thermoelectric device 1200 by a predetermined interval, and the second guide plate 1800-2 may be symmetrically disposed to be spaced apart from the second heat sink 1320 of the second thermoelectric device 1300 by a predetermined interval. Here, the intervals between the guide plates 1800-1 and 1800-2 and the heat sink of each thermoelectric device may affect the pressure difference before and after the second fluid coming into contact with the heat sink of each thermoelectric device passes through the heat sink, and thus affect power generation performance.

According to the embodiment of the present invention, it is intended to maintain the interval between the guide plates 1800-1 and 1800-2 and the heat sink of each thermoelectric device as an interval required to optimize the power generation performance.

FIG. 8 is a perspective view of the thermoelectric device in which a heat sink is disposed on the thermoelectric device according to one embodiment of the present invention, FIG. 9 is a plan view of an upper substrate and an upper electrode included in the thermoelectric element according to one embodiment of the present invention, FIG. 10 is a plan view of a lower substrate and a lower electrode included in the thermoelectric element according to one embodiment of the present invention, and FIG. 11 is a perspective view of a thermoelectric device including a thermoelectric element and a heat sink according to a first embodiment of the present invention.

Referring to FIGS. 8 to 11, a thermoelectric device TD according to an embodiment of the present invention may include a thermoelectric element 200, a heat sink 300 disposed on the thermoelectric element 200, and an electrode connection unit 400.

Specifically, the thermoelectric element 200 includes a first substrate 210, a first insulating layer 220 disposed on the first substrate 210, a plurality of first electrodes disposed on the first insulating layer 220, a plurality of P-type thermoelectric legs 240 and a plurality of N-type thermoelectric legs 250 disposed on the plurality of first electrodes 230, a plurality of second electrodes 260 disposed on the plurality of P-type thermoelectric legs 240 and the plurality of N-type thermoelectric legs 230, a second insulating layer 270 disposed on the plurality of second electrodes 260, and a second substrate 280 disposed on the second insulating layer 270. In addition, the first insulating layer 220 may be disposed between the first substrate 210 and the second substrate 280. In addition, although not shown, a sealing member (not shown) may be further disposed to surround the plurality of first electrodes 230, the plurality of P-type thermoelectric legs 240, the plurality of N-type thermoelectric legs 250, the plurality of second electrodes 260, and the second insulating layer 270.

Here, the first electrode 230, the P-type thermoelectric leg 240, the N-type thermoelectric leg 250, and the second electrode 260 may correspond to the lower electrode 120, the P-type thermoelectric leg 130, the N-type thermoelectric leg 140, and the upper electrode 150 described with reference to FIGS. 6 and 7, respectively. In addition, since the first substrate 210 corresponds to the lower substrate 110, the second substrate 280 corresponds to the upper substrate 160, and the first insulating layer 220 and the second insulating layer 270 correspond to the insulating layer 170, the contents described with reference to FIGS. 6 and 7 may be applied in the same or similar manner.

In addition, at least one of the first substrate 210 and the second substrate 280 may be a metal substrate. For example, at least one of the first substrate 210 and the second substrate 280 may be made of at least one of aluminum, an aluminum alloy, copper, and a copper alloy. The first substrate 210 and the second substrate 280 may also be made of different materials. For example, a substrate requiring more withstand voltage performance of the first substrate 210 and the second substrate 280 may be configured as an aluminum substrate, and a substrate requiring more thermal conductivity may also be configured as a copper substrate.

In this specification, the withstand voltage performance may refer to a characteristic maintained without dielectric breakdown for a predetermined period under a predetermined voltage and a predetermined current. For example, when the dielectric characteristic is maintained without breakdown for 10 seconds under a voltage of AC 2.5 kV and a current of 1 mA, a withstand voltage may be 2.5 kV.

In addition, since a power source is connected to an electrode disposed on a low-temperature portion of the thermoelectric element 200, the low-temperature portion may require higher withstand voltage performance than that of a high-temperature portion. In contrast, when the thermoelectric element 200 is driven, the high-temperature portion of the thermoelectric element 200 may be exposed to a high temperature, for example, about 180° C. or higher, and peeling between the electrode, the insulating layer, and the substrate may be problematic due to different coefficients of thermal expansion of the electrode, the insulating layer, and the substrate. Accordingly, the high-temperature portion of the thermoelectric element 200 may require higher thermal impact mitigation performance than that of the low-temperature portion. Accordingly, a structure of the high-temperature portion and a structure of the low-temperature portion may also be formed differently from each other.

Hereinafter, the connection of the electrode connection unit 400 to the first electrode 230 disposed on the first substrate 210 will be described.

As described above, the first insulating layer 220 is disposed on the first substrate 210, and the plurality of first electrodes 230 are disposed on the first insulating layer 220.

At this time, the plurality of first electrodes 230 may be disposed to form a plurality of electrode outer edges, and the first substrate 210 may have a plurality of substrate outer edges corresponding to the plurality of electrode outer edges. Here, the electrode outer edges may refer to edges of the plurality of first electrodes 230, and the substrate outer edge may refer to an edge of the first substrate 210. For example, when the plurality of first electrodes 230 are disposed in a rectangular shape, the plurality of first electrodes 230 may have first to fourth electrode outer edges E1 to E4, and the first substrate 210 may have first to fourth substrate outer edges S1 to S4 corresponding to the first to fourth electrode outer edges E1 to E4, respectively.

According to the embodiment of the present invention, the electrode connection unit 400 may include a first connection unit 410 and a second connection unit 420 having different polarities. For example, when a (−) terminal is connected to the first connection unit 410, a (+) terminal may be connected to the second connection unit 420. For example, the first connection unit 410 of the electrode connection unit 400 may connect one of the plurality of first electrodes 230 and the (−) terminal, and the second connection unit 420 may connect the other of the plurality of first electrodes 230 and the (+) terminal. Accordingly, a position of the electrode connection unit 400 may affect an insulation resistance of the thermoelectric element 200. The insulation resistance refers to an electrical resistance exhibited by an insulator when a predetermined voltage is applied, and the thermoelectric element 200 should satisfy a predetermined insulation resistance. For example, the thermoelectric element 200 should satisfy the requirement of an insulation resistance of 500 MΩ or more when a DC voltage of 500 V is applied.

According to the embodiment, when the electrode connection unit 400 is connected to some of the plurality of first electrodes 230 disposed on the first electrode outer edge E1, a distance d1 between the first electrode outer edge E1 and the first substrate outer edge S1 may be longer than distances d2 to d4 between the second to fourth electrode outer edges E2 to E4 and the second to fourth substrate outer edges S2 to S4. At this time, the electrode connection unit 400 may be drawn out to the outside of the sealing member (not shown) disposed to surround the first insulating layer 220, the plurality of first electrodes 230, the plurality of P-type thermoelectric legs 240, the plurality of N-type thermoelectric legs 250, the plurality of second electrodes 260, and the second insulating layer 270 between the first substrate 210 and the second substrate 280.

Here, a shortest distance A1 between the electrode connection unit 400 and the first substrate outer edge S1 may be 12 mm or more, preferably, 14 mm or more, and more preferably, 16 mm or more.

In addition, each of a shortest distance B1 between the second substrate outer edge S2 connected to the first substrate outer edge S1 and the first connection unit 410 and a shortest distance B2 between the third substrate outer edge S3 connected to the first substrate outer edge S1 and the second connection unit 420 may be 12 mm or more, preferably, 14 mm or more, and more preferably, 16 mm or more.

Alternatively, each of a shortest distance F1 from a point where the first substrate outer edge S1 and the second substrate outer edge S2 meet, that is, a vertex between the first substrate outer edge S1 and the second substrate outer edge S2 to the first connection unit 410 and a shortest distance F2 from a point where the first substrate outer edge S1 and the third substrate outer edge S3 meet, that is, a vertex between the first substrate outer edge S1 and the third substrate outer edge S3 to the second connection unit 420 may be 16 mm or more, preferably, 19 mm or more, and more preferably, 21 mm or more.

As described above, when the distance between the substrate outer edge and the electrode connection unit 400 is adjusted, it is possible to obtain a thermoelectric element having an insulation resistance of 500 MΩ or more under a DC voltage of 500 V.

At this time, each of the first connection unit 410 and the second connection unit 420 may be a connector into which an electric wire is inserted in a detachable manner. As described above, each of the electrode connection unit 400, the first connection unit 410, and the second connection unit 420 may be disposed outside the sealing member. Accordingly, a wire connection is simple, and it is possible to minimize the possibility of disconnection between the electrode and the wire.

In addition, each of the first connection unit 410 and the second connection unit 420 may be sealed with a resin containing silicon. Accordingly, it is possible to further increase the insulation resistance and withstand voltage performance of the thermoelectric element.

In addition, the first insulating layer 220 may be disposed under the plurality of first electrodes 230 and the electrode connection unit 400 on the first substrate 210, and may have a greater area than those of the first electrode 230 and the electrode connection unit 400. Accordingly, the first electrode 230 and the electrode connection unit 400 may overlap the first insulating layer 220 in a vertical direction (Z-axis direction).

The first insulating layer 220 may have a greater area than that of the second insulating layer 270. Accordingly, the first insulating layer 220 may partially overlap the second insulating layer 270 in the vertical direction (Z-axis direction).

The second insulating layer 270 may be disposed between the second electrode 260 and the second substrate 280. The area of the second insulating layer 270 may be greater than the total area of the plurality of second electrodes 260. Accordingly, the plurality of second electrodes 260 may overlap the second insulating layer 270 in the vertical direction (Z-axis direction).

In addition, the plurality of second electrodes 260 may be disposed to face the plurality of first electrodes 230 with the plurality of P-type thermoelectric legs 240 and the plurality of N-type thermoelectric legs 250 interposed therebetween. The plurality of first electrodes 230 and the plurality of second electrodes 260 may be electrically connected through the plurality of P-type thermoelectric legs 240 and the plurality of N-type thermoelectric legs 250. For example, the plurality of first electrodes 230 and the plurality of second electrodes 260 may be connected in series.

In addition, each of the plurality of second electrodes 260 may be arranged in the same shape under the second substrate 280 or the second insulating layer 270. For example, a length of the second electrode 260 in the first direction (X-axis direction) may be greater than a length of the second electrode 260 in the second direction (Y-axis direction). In other words, long sides of the plurality of second electrodes 260 may be disposed symmetrically in the first direction and short sides of the plurality of second electrodes 260 may be disposed symmetrically in the second direction. However, this structure may be changed depending on the structure of the electrode connection or the like. Here, the first direction is a direction perpendicular to the vertical direction and will be described as the X-axis direction or the like. The second direction is a direction perpendicular to the first direction and will be described as the Y-axis direction or the like. The third direction is the above-described direction, is the same as a direction from the first substrate toward the second substrate, and will be described as the Z-axis direction or the like.

The heat sink 300 may be positioned on the second substrate 280. The heat sink 300 may overlap the second substrate 280 in the third direction (Z-axis direction), and correspond to the heat sinks 1220 and 1320 described above with reference to FIGS. 1 to 5. A shape of the heat sink 300 according to this embodiment may be changed to correspond to a position of the second electrode 260. This will be described below.

FIG. 12 is a plan view showing components of the thermoelectric device according to the first embodiment, FIG. 13 is a cross-sectional view taken along line A-A' in FIG. 12, FIG. 14 is a cross-sectional view taken along line B-B' in FIG. 12, and FIG. 15 is a cross-sectional view taken along line C-C' in FIG. 12.

Referring to FIGS. 12 to 15, the thermoelectric device according to the first embodiment includes the thermoelectric element 200 and the heat sink 300 as described above. In addition, the thermoelectric element 200 may include the first substrate 210, the first insulating layer 220 disposed on the first substrate 210, the plurality of first electrodes 230 disposed on the first insulating layer 220, the plurality of P-type thermoelectric legs 240 and the plurality of N-type thermoelectric legs 250 disposed on the plurality of first electrodes 230, the plurality of second electrodes 260 disposed on the plurality of P-type thermoelectric legs 240 and the plurality of N-type thermoelectric legs 250, the second insulating layer 270 disposed on the plurality of second electrodes 260, and the second substrate 280 disposed on the second insulating layer 270. For a detailed description thereof, the above-described contents may be applied in the same manner.

In an embodiment, the heat sink 300 may be disposed on the second substrate 280 and the second substrate 280 may come into contact with the heat sink 300. At this time, the second substrate 280 may include an upper surface 280a and a lower surface 280b. In addition, the upper surface 280a of the second substrate 280 may come into contact with the heat sink 300. In addition, the second electrode 260 (or the second insulating layer 270) may be disposed on the lower surface 280b of the second substrate 280 and the second electrode 260 (or the second insulating layer 270) may come into contact with the lower surface 280b of the second substrate 280.

In addition, the second substrate 280 may include a first region P1 and a second region P2. The first region P1 is a region which overlaps the second electrode 260 in the vertical direction (Z-axis direction). In addition, the second region P2 is a region which does not overlap the second electrode 260 in the vertical direction (Z-axis direction). The second region P2 may be a region which corresponds to a separation region between adjacent second electrodes 260. Hereinafter, a positional relationship of the heat sink 300 on the first region P1 and the second region P2 of the second substrate 280 will be described.

Specifically, the heat sink 300 may include a plurality of fins 310 and a connection member 320.

The plurality of fins 310 may extend upward, that is, vertically from the upper surface 280a of the second substrate 280 in an XZ plane or an YZ plane.

In addition, the plurality of fins 310 may be disposed to be spaced apart from each other in the first direction (X-axis direction) or the second direction (Y-axis direction). In the first embodiment, the plurality of fins 310 may be disposed to be spaced apart from each other in the first direction (X-axis direction).

In the plurality of fins 310, a separation distance between adjacent fins in the first region P1 may be different from a separation distance between adjacent fins in the second region P2. In an embodiment, in the plurality of fins 310, the separation distance between the adjacent fins may be greater in the second region P2 than in the first region P1.

Specifically, the separation distance between the adjacent fins 310 on the first region P1 (hereinafter, referred to as a "first separation distance SL1") may be different from the separation distance between the adjacent fins 310 on the second region P2 (hereinafter, referred to as a "second separation distance SL2"). In addition, the first separation distance SL1 between the adjacent fins 310 on the first region P1 may be smaller than the second separation distance SL2 between the adjacent fins 310 on the second region P2. In other words, the second separation distance SL2 may be greater than the first separation distance SL1. The separation distances (e.g., first and second separation distances) may be distances between adjacent fins in a direction in which the first connection member 321, the fin 310, and the second connection member 322 are arranged, which will be described below. Accordingly, in the first embodiment, the first separation distance SL1 and the second separation distance SL2 refer to lengths in the first direction (X-axis direction).

With this configuration, heat absorbed from the fluid passing around the heat sink 300 on the first region P1 may be easily transferred to the second electrode 260 through the substrate 280. A path from a contact region between the second substrate 280 and the heat sink 300, particularly, the connection member (e.g., the first connection member), which will be described below, to the second electrode 260 may be decreased, thereby minimizing heat loss. In addition, it is possible to prevent an increase in the differential pressure of the fluid by the plurality of fins 310 by increasing the separation distance (e.g., the second separation distance) between the adjacent fins on the second region P2. Here, the differential pressure refers to a pressure difference before and after the fluid passes through the power generation device. In other words, the thermoelectric device according to the embodiment may minimize the occurrence of mechanical damage due to the differential pressure by decreasing the differential pressure of the fluid in the power generation device or the power generation system including the same.

In addition, when the fins 310 are not present on the second region P2, the separation distance between the adjacent fins 310 may correspond to the separation distance of the second region P2. This may also be applied to other embodiments to be described below in the same manner.

In addition, the first regions P1 and the second regions P2 may be alternately disposed in the first direction (X-axis direction) and the second direction (Y-axis direction). In other words, the second electrode may be disposed in an array form along rows and columns to improve power generation performance or heat exchange performance of the thermoelectric device.

In addition, the first separation distances SL1 between the adjacent fins P1 may be the same as or different from each other on the first region P1. A plurality of first regions P1 may be provided to correspond to the plurality of second electrodes 260.

In an embodiment, the first separation distances between the adjacent fins P1 on the plurality of first regions P1 may also be different from each other depending on respective positions of the first regions P1. A 1-1 separation distance SL1a and a 1-2 separation distance SL1b may be different from each other. At this time, the 1-1 separation distance SL1a and the 1-2 separation distance SL1 may be positioned on the same second electrode. For example, the 1-1 separation distance SL1a may be greater than the 1-2 separation distance SL1b. In other words, the first separation distance may be adjusted to correspond to an overlapping area with the second electrode 260 in the vertical direction. Accordingly, it is possible to improve heat exchange efficiency.

In addition, the 1-1 separation distance SL1a and a 1-3 separation distance SL1c may be different from each other. Alternatively, the 1-2 separation distance SL1b and a 1-4 separation distance SL1d may be different from each other. At this time, the 1-1 separation distance SL1a and the 1-2 separation distance SL1b, and the 1-3 separation distance SL1c and the 1-4 separation distance SL1d may be positioned on the second electrode 260 different from each other.

For example, the 1-1 separation distance SL1a and the 1-2 separation distance SL1b may be smaller than the 1-3 separation distance SL1c and the 1-4 separation distance SL1d. In addition, the 1-1 separation distance SL1a and the 1-2 separation distance SL1b may be positioned to be closer to the fluid inlet than the 1-3 separation distance SL1c and the 1-4 separation distance SL1d. In other words, according to the embodiment, it is possible to improve heat exchange between high temperatures while maintaining the differential pressure of the heat sink 300 by setting the first separation distance to be smaller as it is closer to the fluid inlet. At this time, the first separation distances on the same second electrode may be the same as or different from each other.

The connection member 320 may be disposed between adjacent fins 310 disposed to be spaced apart from each other. In other words, the connection member 320 may connect the adjacent fins 310 disposed to be spaced apart from each other.

According to the embodiment, the connection member 320 may include a first connection member 321 and a second connection member 322. The first connection member 321 may come into contact with the upper surface 280a of the second substrate 280. In addition, the second connection member 322 may be spaced apart from the upper surface 280a of the second substrate 280 and positioned above the upper surface 280a of the second substrate 280.

The first connection member 321 may be connected to the fins 310. In an embodiment, at least one of one end and the other end of the first connection member 321 may come into contact with the fin 310.

The second connection member 322 may be connected to the fin 31. In an embodiment, at least one of one end and the other end of the second connection member 322 may come into contact with the fin 310.

The fin 310 may have one end connected to come into contact with the first connection member 321, and the other end connected to come into contact with the second connection member 322.

The first connection member 321 and the second connection member 322 may be disposed to face each other with respect to the fin. In addition, the first connection member 321 and the second connection member 322 may not be symmetrically disposed with respect to the fin 310. In other words, the first connection member 321 and the second connection member 322 may not overlap in the vertical direction (Z-axis direction).

In addition, a plurality of second electrodes 260 may be provided. In the drawings, the plurality of second electrodes 260 may include a 2-1 electrode 260-1, a 2-2 electrode 260-2, a 2-3 electrode 260-3, and a 2-4 electrode 260-4.

The 2-1 electrode 260-1 and the 2-2 electrode 260-2 may be disposed side by side in the first direction (X-axis direction). In addition, the 2-3 electrode 260-3 and the 2-4 electrode 260-4 may be disposed side by side in the first direction (X-axis direction). In addition, the 2-1 electrode 260-1 and the 2-3 electrode 260-3 may be disposed side by side in the second direction (Y-axis direction). In addition, the 2-2 electrode 260-2 and the 2-4 electrode 260-4 may be disposed side by side in the second direction (Y-axis direction).

According to the embodiment, the plurality of fins 310 may be alternately disposed in the first direction (X-axis direction). In addition, one fin 310 may be disposed on the second electrode 260 in the second direction (Y-axis direction) perpendicular to the first direction, and the fin 310 that overlaps the second electrode 260 disposed in the second direction may be the same. One first connection member 321 may also be disposed on the second electrode 260 in the second direction (Y-axis direction), and the fin 310 that overlaps the second electrode 260 disposed in the second direction may be the same. In addition, one second connection member 322 may also be disposed on the second electrode 260 in the second direction (Y-axis direction), and the fin 310 that overlaps the second electrode 260 disposed in the second direction may be the same. For example, the plurality of fins 310 disposed on the 2-1 electrode 260-1 and the 2-3 electrode 260-3 may be the same as each other. In addition, the plurality of fins 310 disposed on the 2-2 electrode 260-2 and the 2-4 electrode 260-4 may be the same as each other.

In an embodiment, the fin 310, the first connection member 321, and the second connection member 322 may be disposed to extend in the second direction (Y-axis direction). In other words, the plurality of fins 310 may be disposed to extend in the second direction (Y-axis direction) on the plane XY. In addition, the first connection member 321 and the second connection member 322 may also be disposed to extend in the second direction (Y-axis direction) on the plane XY. Accordingly, the fin 310, the first connection member 321, and the second connection member 322 may be alternately disposed in the first direction (X-axis direction). For example, the first connection member 321, the fin 310, the second connection member 322, and the fin 310 may be sequentially and repeatedly disposed in the first direction (X-axis direction).

In addition, since the second separation distance SL2 between the adjacent fins 310 on the second region P2 is different from the first separation distance SL1 between the adjacent fins 310 on the first region P1, a length of the second connection member 322 may also be different depending on the region.

In an embodiment, since the second separation distance SL2 is greater than the first separation distance SL1, the length of the second connection member 322 on the second region P2 may be greater than a length of the second connection member 322 on the first region P1. The length of the second connection member 322 is a length in the same direction as a direction toward adjacent first connection members 321 or adjacent second connection members 322 facing each other. Accordingly, the thermoelectric device according to the embodiment may improve heat efficiency at the same time as decreasing the differential pressure.

In addition, in this embodiment, only the second connection member 322 may be disposed in the second region P2. Accordingly, the second region P2 may overlap only the second connection member 322 in the third direction (Z-axis direction). With this configuration, it is possible to improve the decrease in the differential pressure.

In addition, according to the embodiment, as described above, in the second electrode 260, a first length EL1 in the first direction (X-axis direction) may be smaller than a second length EL2 in the second direction (Y-axis direction). At this time, the P-type thermoelectric leg 240 and the N-type thermoelectric leg 250 connected to come into contact with the second electrode 260 may be disposed side by side in the second direction (Y-axis direction).

The fin 310, the first connection member 321, and the second connection member 322 according to the embodiment may extend to correspond to a direction in which the P-type thermoelectric leg 240 and the N-type thermoelectric leg 250 are disposed on one electrode (e.g., the second electrode). Accordingly, since the fin 310, the first connection member 321, and the second connection member 322 extend along a long side of the second electrode, the thermoelectric device according to the embodiment can improve heat efficiency by increasing a heat exchange time between the high-temperature fluid and the heat sink.

However, it should be understood that when the P-type thermoelectric leg 240 and the N-type thermoelectric leg 250 are disposed side by side in the first direction (X-axis direction), a shape of the second electrode 260 may be changed to correspond to the P-type thermoelectric leg 240 and the N-type thermoelectric leg 250.

FIG. 16 is a modified example of FIG. 12, and FIG. 17 is another modified example of FIG. 12.

Referring to FIG. 16, a thermoelectric device according to a modified example includes a thermoelectric element 200 and a heat sink 300 as described above. In addition, the thermoelectric element 200 may include a first substrate 210, a first insulating layer 220 disposed on the first substrate 210, a plurality of first electrodes 230 disposed on the first insulating layer 220, a plurality of P-type thermoelectric legs 240 and a plurality of N-type thermoelectric legs 250 disposed on the plurality of first electrodes 230, a plurality of second electrodes 260 disposed on the plurality of P-type thermoelectric legs 240 and the plurality of N-type thermo- electric legs 250, a second insulating layer 270 disposed on the plurality of second electrodes 260, and a second substrate 280 disposed on the second insulating layer 270. For a detailed description thereof, the above-described contents may be applied in the same manner.

In addition, the second substrate 280 may include an upper surface 280a and a lower surface 280b. The upper surface 280a of the second substrate 280 may come into contact with the heat sink 300. In addition, the second electrode 260 (or the second insulating layer 270) may be disposed on the lower surface 280b of the second substrate 280, and may come into contact with the lower surface 280b of the second substrate 280.

In addition, the second substrate 280 may include a first region P1 and a second region P2. The first region P1 is a region which overlaps the second electrode 260 in the vertical direction (Z-axis direction). The second region P2 is a region which does not overlap the second electrode 260 in the vertical direction (Z-axis direction). The second region P2 may correspond to a separation region between adjacent second electrodes 260.

The heat sink 300 may include a plurality of fins 310 and a connection member 320.

The plurality of fins 310 may be disposed to be spaced apart from each other in the first direction (X-axis direction) or the second direction (Y-axis direction). In the first embodiment, the plurality of fins 310 may be disposed to be spaced apart from each other in the first direction (X-axis direction).

In the plurality of fins 310, a separation distance between adjacent fins may be greater in the second region P2 than in the first region P1. Specifically, a first separation distance SL1 between adjacent fins 310 on the first region P1 may be different from a second separation distance SL2 between adjacent fins 310 on the second region P2. In addition, the first separation distance SL1 between the adjacent fins 310 on the first region P1 may be smaller than the second separation distance SL2 between the adjacent fins 310 on the second region P2. In other words, the second separation distance SL2 may be greater than the first separation distance SL1. In this embodiment, the first separation distance SL1 and the second separation distance SL2 refer to lengths in the first direction (X-axis direction). With this configuration, heat absorbed from the fluid passing around the heat sink 300 on the first region P1 may be easily transferred to the second electrode 260 through the substrate 280. A path from a contact region between the second substrate 280 and the heat sink 300, particularly, the connection member (e.g., the first connection member), which will be described below, to the second electrode 260 may be decreased, thereby minimizing heat loss. In addition, it is possible to prevent an increase in the differential pressure of the fluid by the plurality of fins 310 by increasing the separation distance (e.g., the second separation distance) between the adjacent fins on the second region P2. Here, the differential pressure refers to a pressure difference before and after the fluid passes through the power generation device. In other words, the thermoelectric device according to the embodiment may minimize the occurrence of mechanical damage due to the differential pressure by decreasing the differential pressure of the fluid in the power generation device or the power generation system including the same.

In addition, the first regions P1 and the second regions P2 may be alternately disposed in the first direction (X-axis direction) and the second direction (Y-axis direction). In other words, the second electrode may be disposed in an array form along rows and columns to improve power generation performance or heat exchange performance of the thermoelectric device.

The connection member 320 may be disposed between adjacent fins 310 disposed to be spaced apart from each other. In other words, the connection member 320 may connect the adjacent fins 310 disposed to be spaced apart from each other.

In addition, as described above, the connection member 320 may include a first connection member 321 and a second connection member 322. The first connection member 321 may come into contact with the upper surface 280a of the second substrate 280. In addition, the second connection member 322 may be spaced apart from the upper surface 280a of the second substrate 280 and positioned above the upper surface 280a of the second substrate 280.

In addition, the first connection member 321 may be connected to the fin 310. At least one of one end and the other end of the first connection member 321 may come into contact with the fin 310. The second connection member 322 may be connected to the fin 31. In an embodiment, at least one of one end and the other end of the second connection member 322 may come into contact with the fin 310. In addition, the fin 310 may have one end connected to come into contact with the first connection member 321 and the other end connected to come into contact with the second connection member 322. Accordingly, the first connection member 321 and the second connection member 322 may be disposed to face each other with respect to the fin. In addition, the first connection member 321 and the second connection member 322 may not be symmetrically disposed with respect to the fin 310.

In addition, the fin 310, the first connection member 321, and the second connection member 322 may be disposed to extend in the second direction (Y-axis direction). In other words, the plurality of fins 310 may be disposed to extend in the second direction (Y-axis direction) on a plane XY. In addition, the first connection member 321 and the second connection member 322 may also be disposed to extend in the second direction (Y-axis direction) on the plane XY. Accordingly, the fin 310, the first connection member 321, and the second connection member 322 may be alternately disposed in the first direction (X-axis direction). For example, the first connection member 321, the fin 310, the second connection member 322, and the fin 310 may be sequentially and repeatedly disposed in the first direction (X-axis direction).

In addition, since the second separation distance SL2 between the adjacent fins 310 on the second region P2 is different from the first separation distance SL1 between the adjacent fins 310 on the first region P1, a length of the second connection member 322 may also be different depending on the region.

In addition, since the second separation distance SL2 is greater than the first separation distance SL1, the length of the second connection member 322 on the second region P2 may be greater than the length of the second connection member 322 on the first region P1. The length of the second connection member 322 is a length in the same direction as a direction of adjacent first connection members 321 or adjacent second connection members 322 facing each other. Accordingly, the thermoelectric device according to the embodiment may improve heat efficiency at the same time as decreasing the differential pressure.

In the modified example, the second connection members 322 and a part of the fin 310 may be disposed in the second region P2. In other words, at least a part of the fin 310 may be disposed between adjacent second electrodes, and may overlap the second region P2 in the third direction (Z-axis direction).

Accordingly, the fin 310 may at least partially overlap the outer surface of the second electrode 260 on the second region P2. With this configuration, it is possible to improve transmission efficiency when the heat sink transmits an amount of heat received from the high-temperature fluid to the second electrode 260. This is because when heat is transmitted to the second electrode 260 through the fin 310, heat is transmitted to the entire second electrode, that is, the entire upper surface of the second electrode, thereby increasing a heat transmission rate.

Referring to FIG. 17, the thermoelectric device according to another modified example may be applied in the same manner as the above-described thermoelectric device according to the modified example except for contents which will be described below.

In the thermoelectric device according to another modified example, a first connection member 321, a second connection member 322, and a fin 310 may be disposed in a second region P2.

Specifically, at least one fin 310 may be disposed on the second region P2. Accordingly, at least one of the plurality of fins 310 may overlap the second region P2.

In addition, a partial region of at least one of the first connection members 321 may be disposed on the second region P2 to overlap the second region P2. Accordingly, the first connection members 321 may also be disposed on both the first region P1 and the second region P2.

In addition, at least one second connection member 322 may be disposed between outer surfaces 260a of adjacent second electrodes 260.

In the second region P2, the outer surface 260a of the second electrode 260 may have a separation distance d11 from adjacent fin 310.

For example, one fin 310 may be disposed between the outer surfaces 260a of the adjacent second electrodes 260, and a fin 310 adjacent to the one fin 310 may partially overlap the second region P2 or may also be disposed on the first region P1. Alternatively, two or more fins 310 may also be disposed between the outer surfaces 260a of the adjacent second electrodes 260.

With this configuration, as described above, it is possible to improve the transmission efficiency when the heat sink transmits an amount of heat received from the high-temperature fluid to the second electrode 260. In addition, the thermoelectric device according to the modified example can prevent the shape of the connection member from being changed by a force applied to the connection member when a bonding with the upper surface 280a of the second substrate 280 is performed by decreasing a length in the first direction of the second connection member on the second region P2 and pressurizing the heat sink upon manufacturing.

FIG. 18 is a perspective view of a thermoelectric device including a thermoelectric element and a heat sink according to a second embodiment of the present invention, FIG. 19 is a plan view showing components of the thermoelectric device according to the second embodiment, FIG. 20 is a cross-sectional view taken along line D-D' in FIG. 19, FIG. 21 is a cross-sectional view taken along line E-E' in FIG. 19, and FIG. 22 is a cross-sectional view taken along line F-F' in FIG. 19.

Referring to FIGS. 18 to 22, the thermoelectric device according to the second embodiment includes a thermoelectric element 200 and a heat sink 300 as described above.

In the second embodiment, the thermoelectric element 200 may include a first substrate 210, a first insulating layer 220 disposed on the first substrate 210, a plurality of first electrodes 230 disposed on the first insulating layer 220, a plurality of P-type thermoelectric legs 240 and a plurality of N-type thermoelectric legs 250 disposed on the plurality of first electrodes 230, a plurality of second electrodes 260 disposed on the plurality of P-type thermoelectric legs 240 and the plurality of N-type thermoelectric legs 250, a second insulating layer 270 disposed on the plurality of second electrodes 260, and a second substrate 280 disposed on the second insulating layer 270. For a detailed description thereof, the contents described with reference to FIGS. 1 to 10 may be applied in the same manner as in the first embodiment.

First, the second substrate 280 may include a first region P1 and a second region P2. The first region P1 is a region which overlaps the second electrode 260 in the vertical direction (Z-axis direction). The second region P2 is a region which does not overlap the second electrode 260 in the vertical direction (Z-axis direction). The second region P2 may correspond to a separation region between adjacent second electrodes 260.

In addition, the second substrate 280 may include an upper surface 280a and a lower surface 280b. The upper surface 280a of the second substrate 280 may come into contact with the heat sink 300. In addition, the second electrode 260 (or the second insulating layer 270) may be disposed on the lower surface 280b of the second substrate 280, and may come into contact with the lower surface 280b of the second substrate 280.

In addition, the heat sink 300 may include a plurality of fins 310 and a connection member 320. The plurality of fins 310 may be disposed to be spaced apart from each other in the first direction (X-axis direction) or the second direction (Y-axis direction). In the second embodiment, the plurality of fins 310 may be disposed to be spaced apart from each other in the second direction (Y-axis direction).

In the plurality of fins 310, a separation distance between adjacent fins may be greater in the second region P2 than in the first region P1. Specifically, a first separation distance SL1' between adjacent fins 310 on the first region P1 may be different from a second separation distance SL2' between adjacent fins 310 on the second region P2. In addition, the first separation distance SL1' between the adjacent fins 310 on the first region P1 may be smaller than the second separation distance SL2' between the adjacent fins 310 on the second region P2. In other words, the second separation distance SL2' may be greater than the first separation distance SL1'. The separation distances (e.g., first and second separation distances) may be distances between adjacent fins in a direction in which the first connection member 321, the fin 310, and the second connection member 322 are arranged, which will be described below. Accordingly, in the second embodiment, the first separation distance SL1' and the second separation distance SL2' refer to lengths in the second direction (Y-axis direction).

With this configuration, heat absorbed from the fluid passing around the heat sink 300 on the first region P1 may be easily transferred to the second electrode 260 through the substrate 280. A path from a contact region between the second substrate 280 and the heat sink 300, particularly, the connection member (e.g., the first connection member), which will be described below, to the second electrode 260 may be decreased, thereby minimizing heat loss. In addition, it is possible to prevent an increase in the differential pressure of the fluid by the plurality of fins 310 by increasing the separation distance (e.g., the second separation distance) between the adjacent fins on the second region P2. In addition, the thermoelectric device according to the second embodiment may minimize the occurrence of mechanical damage due to the differential pressure by decreasing the differential pressure of the fluid in the power generation device or the power generation system including the same.

In addition, the first regions P1 and the second regions P2 may be alternately disposed in the first direction (X-axis direction) and the second direction (Y-axis direction). In other words, the second electrode may be disposed in an array form along rows and columns to improve power generation performance or heat exchange performance of the thermoelectric device.

The connection member 320 may be disposed between adjacent fins 310 disposed to be spaced apart from each other. In other words, the connection member 320 may connect the adjacent fins 310 disposed to be spaced apart from each other.

According to the embodiment, the connection member 320 may include a first connection member 321 and a second connection member 322. The first connection member 321 may come into contact with the upper surface 280a of the second substrate 280. In addition, the second connection member 322 may be spaced apart from the upper surface 280a of the second substrate 280 and positioned above the upper surface 280a of the second substrate 280.

As described above, the first connection member 321, the fin 310, and the second connection member 322 may come into contact with each other and may be connected to each other. For a description thereof, the contents described in the first embodiment may be applied in the same manner.

In addition, a plurality of second electrodes 260 may be provided. In the drawings, the plurality of second electrodes 260 may include a 2-1 electrode 260-1, a 2-2 electrode 260-2, a 2-3 electrode 260-3, and a 2-4 electrode 260-4. For a description thereof, the above description may be applied in the same manner except for the following description.

The plurality of fins 310 may be alternately disposed in the second direction (Y-axis direction). Accordingly, electrodes disposed in the same row may be disposed under the same fin 310. For example, the plurality of fins 310 disposed on the 2-1 electrode 260-1 and the 2-2 electrode 260-2 may be the same as each other. In addition, the plurality of fins 310 disposed on the 2-3 electrode 260-3 and the 2-4 electrode 260-4 may be the same as each other.

In addition, in the second embodiment, the fin 310, the first connection member 321, and the second connection member 322 may be disposed to extend in the first direction (X-axis direction). In addition, the plurality of fins 310 may be disposed to extend in the first direction (X-axis direction) on a plane XY. In addition, the first connection member 321 and the second connection member 322 may also be disposed to extend in the first direction (X-axis direction) on the plane XY. Accordingly, the fin 310, the first connection member 321, and the second connection member 322 may be alternately disposed in the second direction (Y-axis direction). For example, the first connection member 321, the fin 310, the second connection member 322, and the fin 310 may be sequentially and repeatedly disposed in the second direction (Y-axis direction).

In addition, since the second separation distance SL2' between the adjacent fins 310 on the second region P2 is different from the first separation distance SL1' between the adjacent fins 310 on the first region P1, a length of the second connection member 322 may also be different depending on the region.

In an embodiment, since the second separation distance SL2' is greater than the first separation distance SL1', a length of the second connection member 322 on the second region P2 may be greater than a length of the second connection member 322 on the first region P1. Here, the length of the second connection member 322 is a length in the same direction as a direction of adjacent first connection members 321 or adjacent second connection members 322 facing each other. In addition, since the length of the second connection member 322 on the second region P2 is greater than the length of the second connection member 322 on the first region P1, the thermoelectric device may improve heat efficiency as the same time as decreasing the differential pressure.

In addition, in this embodiment, only the second connection member 322 may be disposed in the second region P2. The second region P2 may overlap only the second connection member 322 in the third direction (Z-axis direction). With this configuration, it is possible to improve the decrease in the differential pressure.

Alternatively, as described above, the second connection member 322 and a part of the fin 310 may be disposed in the second region P2.

Alternatively, the second connection member 322, the fin 310, and at least a part of the first connection member 321 may be disposed in the second region P2.

In addition, according to the embodiment, as described above, a first length of the second electrode 260 in the first direction (X-axis direction) may be smaller than a second length of the second electrode 260 in the second direction (Y-axis direction). At this time, the P-type thermoelectric leg 240 and the N-type thermoelectric leg 250 connected to come into contact with the second electrode 260 may be disposed side by side in the second direction (Y-axis direction).

FIG. 23 is a perspective view of a thermoelectric device including a thermoelectric element and a heat sink according to a third embodiment of the present invention, FIG. 24 is a plan view showing components of the thermoelectric device according to the third embodiment, FIG. 25 is a cross-sectional view taken along line I-I' in FIG. 24, and FIG. 26 is a cross-sectional view taken along line J-J' in FIG. 24.

Referring to FIGS. 23 to 26, the thermoelectric device according to the third embodiment includes a thermoelectric element 200 and a heat sink 300 as described above.

In the third embodiment, the thermoelectric element 200 may include a first substrate 210, a first insulating layer 220 disposed on the first substrate 210, a plurality of first electrodes 230 disposed on the first insulating layer 220, a plurality of P-type thermoelectric legs 240 and a plurality of N-type thermoelectric legs 250 disposed on the plurality of first electrodes 230, a plurality of second electrodes 260 disposed on the plurality of P-type thermoelectric legs 240 and the plurality of N-type thermoelectric legs 250, a second insulating layer 270 disposed on the plurality of second electrodes 260, and a second substrate 280 disposed on the second insulating layer 270. For a detailed description thereof, the contents described with reference to FIGS. 1 to 10 may be applied in the same manner as in other embodiments.

First, the second substrate 280 may include a first region P1 and a second region P2. The first region P1 is a region which overlaps the second electrode 260 in the vertical direction (Z-axis direction). The second region P2 is a region which does not overlap the second electrode 260 in the vertical direction (Z-axis direction). The second region P2 may correspond to a separation region between adjacent second electrodes 260.

In addition, the second substrate 280 may include an upper surface 280a and a lower surface 280b. The upper surface 280a of the second substrate 280 may come into contact with the heat sink 300. In addition, the second electrode 260 (or the second insulating layer 270) may be disposed on the lower surface 280b of the second substrate 280, and may come into contact with the lower surface 280b of the second substrate 280.

In addition, the heat sink 300 may include a plurality of fins 310 and a connection member 320. The plurality of fins 310 may be disposed to be spaced apart from each other in the first direction (X-axis direction) or the second direction (Y-axis direction). In the second embodiment, the plurality of fins 310 may be disposed to be spaced apart from each other in the second direction (Y-axis direction). In the plurality of fins 310, a separation distance between adjacent fins may be greater in the second region P2 than in the first region P1. In the third embodiment, the separation distances between the adjacent fins refer to lengths in the first direction (X-axis direction) and the second direction (Y-axis direction).

Specifically, a first separation distance SL1" between adjacent fins 310 on the first region P1 is different from a second separation distance SL2" between adjacent fins 310 on the second region P2. In addition, the first separation distance SL1" between the adjacent fins 310 on the first region P1 may be smaller than the second separation distance SL2" between the adjacent fins 310 on the second region P2. In other words, the second separation distance SL2" may be greater than the first separation distance SL1".

At this time, the first separation distances SL1" may refer to a length in the first direction (X-axis direction) or a length in the second direction (Y-axis direction), and may be the same as or different from each other. Likewise, the second separation distances SL2" may also refer to a length in the first direction (X-axis direction) or a length in the second direction (Y-axis direction), and may be the same as or different from each other.

However, as described above, since the first separation distance SL1" is smaller than the second separation distance SL2", heat absorbed from the fluid passing around the heat sink 300 on the first region P1 may be easily transferred to the second electrode 260 through the substrate 280.

Accordingly, a path from a contact region between the second substrate 280 and the heat sink 300, particularly, the connection member (e.g., the first connection member), which will be described below, to the second electrode 260 may be decreased, thereby minimizing heat loss.

In addition, it is possible to prevent an increase in the differential pressure of the fluid by the plurality of fins 310 by increasing the separation distance (e.g., the second separation distance) between the adjacent fins on the second region P2.

In addition, the thermoelectric device according to the third embodiment may minimize the occurrence of mechanical damage due to the differential pressure by decreasing the differential pressure of the fluid in the power generation device or the power generation system including the same.

In addition, the first regions P1 and the second regions P2 may be alternately disposed in the first direction (X-axis direction) and the second direction (Y-axis direction). In other words, the second electrode may be disposed in an array form along rows and columns to improve power generation performance or heat exchange performance of the thermoelectric device.

In addition, the connection member 320 may be disposed between adjacent fins 310 disposed to be spaced apart from each other. In other words, the connection member 320 may connect the adjacent fins 310 disposed to be spaced apart from each other.

According to the embodiment, the connection member 320 may include a first connection member 321 and a second connection member 322. The first connection member 321 may come into contact with the upper surface 280a of the second substrate 280. In addition, the second connection member 322 may be spaced apart from the upper surface 280a of the second substrate 280 and positioned above the upper surface 280a of the second substrate 280.

In addition, the first connection member 321, the fin 310, and the second connection member 322 may come into contact with each other and may be connected to each other. For a description thereof, the contents described in the other embodiments may be applied in the same manner.

In addition, a plurality of second electrodes 260 may be provided. In the drawings, the plurality of second electrodes 260 may include a 2-1 electrode 260-1, a 2-2 electrode 260-2, a 2-3 electrode 260-3, and a 2-4 electrode 260-4. For a description thereof, the above description may be applied in the same manner except for the following description.

The plurality of fins 310 may be alternately disposed in the first direction (X-axis direction) and the second direction (Y-axis direction). Accordingly, electrodes disposed in the same rows or columns may be disposed under different fins 310. For example, different fins 310, that is, fins 310 disposed to be spaced apart from each other may be positioned on the 2-1 electrode 260-1 to the 2-4 electrode 260-4.

In addition, in the third embodiment, the fin 310, the first connection member 321, and the second connection member 322 may not extend between the adjacent electrodes in first direction (X-axis direction) or the second direction (Y-axis direction) unlike the first embodiment or the second embodiment. In other words, in the third embodiment, in the heat sink 300, the first connection member 321 and the second connection member 322 may be alternately disposed in the first direction (X-axis direction) and the second direction (Y-axis direction). For example, the first connection member 321, the fin 310, the second connection member 322, and the fin 310 are sequentially and repeatedly disposed in the first direction (X-axis direction) and the second direction (Y-axis direction).

In addition, as described above, since the second separation distance SL2' between the adjacent fins 310 on the second region P2 is different from the first separation distance SL1' between the adjacent fins 310 on the first region P1, the length of the second connection member 322 may also be different depending on the region.

In the third embodiment, since the second separation distance SL2" is greater than the first separation distance SL1", a length of the second connection member 322 on the second region P2 may be greater than a length of the second connection member 322 on the first region P1. In addition, since the length of the second connection member 322 on the second region P2 is greater than the length of the second connection member 322 on the first region P1, the thermoelectric device may improve heat efficiency as the same time as decreasing the differential pressure.

In addition, only the second connection member 322 may be disposed in the second region P2. The second region P2 may overlap only the second connection member 322 in the third direction (Z-axis direction). With this configuration, it is possible to improve the decrease in the differential pressure.

Alternatively, the above-described modified example is applied and thus the second connection member 322 and a part of the fin 310 may be disposed in the second region P2.

Alternatively, the second connection member 322, the fin 310, and at least a part of the first connection member 321 may be disposed in the second region P2.

FIG. 27 is a perspective view of a thermoelectric device including a thermoelectric element and a heat sink according to a fourth embodiment of the present invention, FIG. 28 is a perspective view of the heat sink and a bonding member of the thermoelectric device according to the fourth embodiment, and FIG. 29 is a bottom view of the heat sink and the bonding member of the thermoelectric device according to the fourth embodiment.

Referring to FIGS. 27 to 29, as described above, a thermoelectric device TD according to the fourth embodiment includes a thermoelectric element 200, a heat sink 3000 disposed on the thermoelectric element 200, and a bonding member CU configured to couple the heat sink 3000 and the thermoelectric element 200 between the heat sink 3000 and the thermoelectric element 200.

The bonding member CU may be disposed between the thermoelectric element 200 and the heat sink 3000. The bonding member CU may be made of a material that conducts heat. For example, the bonding member CU may be made of a material used for soldering, such as silver paste or Sn, such as PbSn or CuAgSn. However, the present invention is not limited to these materials.

In addition, the bonding member CU may be made of a material having heat resistance to a high temperature of a fluid passing through the heat sink 3000.

In an embodiment, the bonding member CU may be positioned in a groove G of the heat sink 3000. In other words, the bonding member CU may be positioned in the groove G formed on a bottom surface of a lower member 3210. With this configuration, it is possible to improve a coupling force between the heat sink 3000 and the thermoelectric element 200. In addition, since the bonding member CU is positioned in the groove G and is not exposed to the outside (e.g., air), it is possible to improve the reliability of the thermoelectric device. In addition, the heat sink 3000 and the thermoelectric element 200, particularly, a second substrates 280 come into contact with each other, so that it is possible to prevent an increase in differential pressure by decreasing a movement area of the fluid by the bonding member CU. Structures of the bonding member CU and the heat sink 3000 will be described below.

In addition, the heat sink 3000 to be described below corresponds to the heat sink 300 described above, the lower member 3210 corresponds to the first connection member 321 described above, and an upper member 3220 corresponds to the second connection member 322 described above. Accordingly, the above-described contents may be applied in the same manner except for contents of each element to be described below.

More specifically, in the thermoelectric device TD according to the embodiment, the heat sink 3000 may include the lower member 3210 coming into contact with the thermoelectric element 200, an extension member 3100 connected to the lower member, and the upper member 3220 coming into contact with the extension member 3100 and disposed to be spaced apart from the lower member 3210. This may also be applied to various embodiments to be described below in the same manner.

In addition, the lower member 3210 may at least partially come into contact with the second substrate 280 of the thermoelectric element 200. Accordingly, heat from the fluid may be transmitted/absorbed to the thermoelectric element through the heat sink 3000, particularly, the lower member 3210.

In this embodiment, the lower member 3210 may extend in the second direction (Y-axis direction). In other words, the lower member 3210 may overlap a plurality of second electrodes 260 arranged in the second direction (Y-axis direction) in the third direction (Z-axis direction).

In addition, one end and the other end of the lower member 3210 may be connected to come into contact with the extension member 3100.

In addition, the lower member 3210 may include the groove G as described above. The groove G may protrude in the third direction (Z-axis direction). In addition, the groove G may be positioned on a central portion of the lower member 3210. Accordingly, an edge of the lower member 3210 may come into contact with an upper surface 280*a* of the second substrate 280. Alternatively, a bottom surface of the groove G in the lower member 3210, which will be described below, may be spaced apart from the upper surface 280*a* of the second substrate 280 in the third direction (Z-axis direction).

One end of the extension member 3100 may come into contact with the lower member 3210 and may be connected to the lower member 3210. In addition, the other end of the extension member 3100 may come into contact with the upper member 3220 to be described below and may be connected to the upper member 3220. In addition, one end of the extension member 3100 may be positioned under the other end thereof. In other words, one end may be positioned closer to the second substrate in the third direction than the other end. Here, the lower portion refers to a region of a first substrate side with respect to the first substrate and the second substrate and a region in a direction opposite to the third direction, and the upper portion refers to a region of the second substrate side and a region in the third direction.

In addition, the extension member 3100 may be disposed between the lower member 3210 and the upper member 3220. Accordingly, the lower member 3210 and the upper member 3220 may be disposed to be spaced apart from each other with respect to the extension member 3100.

However, the lower member 3210 and the upper member 3220 may not face each other with respect to the extension member 3100. In other words, the lower member 3210 and the upper member 3220 may not overlap each other in the third direction (Z-axis direction). Accordingly, it is possible to increase the heat exchange efficiency by increasing a surface cross-sectional area of the heat sink 3000.

In an embodiment, the lower member 3210, the extension member 3100, the upper member 3220, and the extension member 3100 may be sequentially and alternately disposed. In particular, the lower member 3210, the extension member 3100, the upper member 3220, and the extension member 3100 may be sequentially disposed in the first direction (X-axis direction). This will be described below.

In addition, the lower member 3210, the extension member 3100, the upper member 3220, and the extension member 3100 may be disposed to extend in the second direction (Y-axis direction). Correspondingly, the bonding member CU seated in the groove G may also be disposed to extend in the second direction (Y-axis direction). In addition, the bonding member CU may be disposed to be spaced apart in the first direction (X-axis direction) to correspond to the lower member 3210.

FIG. 30 is a plan view showing components of the thermoelectric device according to the fourth embodiment, FIG. 31 is a cross-sectional view taken along line A-A' in FIG. 30, FIG. 32 is a cross-sectional view taken along line B-B' in FIG. 30, and FIG. 33 is a cross-sectional view taken along line C-C' in FIG. 30.

Referring to FIGS. 30 to 33, the second electrodes 260 may be disposed in an array form along rows and columns to improve power generation performance or heat exchange performance of the thermoelectric device.

According to the embodiment, a first length EL1 in the first direction (X-axis direction) of the second electrode 260 may be smaller than a second length EL2 in the second direction (Y-axis direction). At this time, a P-type thermoelectric leg 240 and a N-type thermoelectric leg 250 connected to come into contact with the second electrode 260 may be disposed side by side in the second direction (Y-axis direction).

The extension member 3100, the lower member 3210, and the upper member 3220 according to the embodiment may extend in a direction corresponding to the direction in which the P-type thermoelectric legs 240 and the N-type thermoelectric legs 250 disposed on one electrode (e.g., the second electrode) are disposed. Accordingly, since the extension member 3100, the lower member 3210, and the upper member 3220 extend along a long side of the second electrode, the thermoelectric device according to the embodiment may improve heat efficiency by increasing a heat exchange time between the high-temperature fluid and the heat sink.

However, it should be understood that when the P-type thermoelectric leg 240 and the N-type thermoelectric leg 250 are disposed side by side in the first direction (X-axis direction), a shape of the second electrode 260 may be changed to correspond to the P-type thermoelectric leg 240 and the N-type thermoelectric leg 250.

In the drawings, the plurality of second electrodes 260 may include a 2-1 electrode 260-1, a 2-2 electrode 260-2, a 2-3 electrode 260-3, and a 2-4 electrode 260-4.

The 2-1 electrode 260-1 and the 2-2 electrode 260-2 may be disposed side by side in the first direction (X-axis direction). In addition, the 2-3 electrode 260-3 and the 2-4 electrode 260-4 may be disposed side by side in the first direction (X-axis direction). In addition, the 2-1 electrode 260-1 and the 2-3 electrode 260-3 may be disposed side by side in the second direction (Y-axis direction). In addition, the 2-2 electrode 260-2 and the 2-4 electrode 260-4 may be disposed side by side in the second direction (Y-axis direction).

According to the embodiment, a plurality of extension members 3100 may be alternately disposed in the first direction (X-axis direction). In addition, one extension member 3100 may be disposed on the second electrode 260 in the second direction (Y-axis direction) perpendicular to the first direction, and the extension member 3100 that overlaps the second electrode 260 disposed in the second direction may be the same. One lower member 3210 may also be disposed on the second electrode 260 in the second direction (Y-axis direction), and the extension member 3100 that overlaps the second electrode 260 disposed in the second direction may be the same. In addition, one upper member 3220 may also be disposed on the second electrode 260 in the second direction (Y-axis direction), and the extension member 3100 that overlaps the second electrode 260 disposed in the second direction may be the same. For example, the plurality of extension members 3100 disposed on the 2-1 electrode 260-1 and the 2-3 electrode 260-3 may be the same as each other. In addition, the plurality of extension members 3100 disposed on the 2-2 electrode 260-2 and the 2-4 electrode 260-4 may be the same as each other.

In an embodiment, the extension member 3100, the lower member 3210, and the upper member 3220 may be disposed to extend in the second direction (Y-axis direction). In other words, the plurality of extension members 3100 may be disposed to extend in the second direction (Y-axis direction) on a plane XY. In addition, the lower member 3210 and the upper member 3220 may also be disposed to extend in the second direction (Y-axis direction) on the plane XY. Accordingly, the extension member 3100, the lower member 3210, and the upper member 3220 may be alternately disposed in the first direction (X-axis direction). For example, the lower member 3210, the extension member 3100, the upper member 3220, and the extension member 3100 may be sequentially and repeatedly disposed in the first direction (X-axis direction).

In addition, the heat sink 3000 may have a concave portion formed by the extension member 3100 and the lower member 3210 and a convex portion formed by the extension member 31 and the upper member 3220. According to the embodiment, in the heat sink 3000, the extension member 3100 and the lower member 3210 may be configured as the concave portion having a structure which is concave upward (e.g., in a direction from the thermoelectric element toward the heat sink). In addition, in the heat sink 3000, the extension member 3100 and the upper member 3220 may be configured as the convex portion having a structure which is convex upward (e.g., in a direction from the thermoelectric element toward the heat sink). However, in the case of the lower side, the concave portion may also be transformed into the convex portion, and the convex portion may also be transformed into the concave portion.

In addition, as described above, the concave portions and the convex portions may be sequentially and repeatedly disposed in the first direction (X-axis direction). In addition, since the concave portion is composed of the lower member 3210, the grooves G disposed on the bottom surface of the lower member 3210 may also be sequentially and repeatedly disposed with the convex portion in the first direction (X-axis direction).

In addition, in an embodiment, the groove G may also extend in the second direction (the Y-axis direction) like the lower member 3210 and the upper member 3220.

First, the groove G may be positioned at a center of the lower member 3210. Accordingly, the lower member 3210 may include a first member region PP1 overlapping the groove G and a second member region PP2 outside the groove G or coming into contact with the second substrate 280. In other words, in this embodiment, the first member region PP1 may overlap the bonding member CU in the vertical direction.

In an embodiment, the lower member 3210 may include a first edge M1 to a fourth edge M4. The first edge M1 and the second edge M2 may be disposed to face each other, and the third edge M3 and the fourth edge M4 may be disposed to face each other.

In addition, the first edge M1 and the second edge M2 may be disposed between the third edge M3 and the fourth edge M4. At this time, the first edge M1 and the second edge M2 may extend in the second direction (Y-axis direction), and may be long sides of the lower member 3210. In addition, the third edge M3 and the fourth edge M4 may extend in the first direction (X-axis direction), and may be short sides of the lower member 3210.

In addition, the groove G may be disposed to be spaced apart from the first edge M1 and the second edge M2. In other words, the groove G may have a first separation distance d11 from the first edge M1 or the second edge M2.

In addition, the groove G may be disposed to be spaced apart from the third edge M3 and the fourth edge M4. In other words, the groove G may have a second separation distance d12 from the third edge M3 or the fourth edge M4.

In an embodiment, the first separation distance d11 and the second separation distance d12 may be the same. With this configuration, it is possible to minimize the overflow of the bonding member CU to a region other than the groove G or one side. In addition, it is possible to prevent the reliability of the thermoelectric device from being lowered due to an imbalance in a bonding force at the same time as improving the bonding force between the lower member 3210 and the second substrate 280.

The groove G may be positioned on a central portion C11 of the lower member 3210. Here, the central portion C11 may be an intersection of a bisector of the first edge M1 and the second edge M2 and a bisector of the third edge M3 and the fourth edge M4. The central portion C11 may be a center of gravity or the like as the center of the lower member 3210 or the groove G.

In addition, according to the embodiment, at least a part of the groove G may overlap the second electrode 260 in the vertical direction. In particular, as described above, the groove G may extend in the second direction (Y-axis direction) and overlap the second electrode 260 arranged in the second direction (Y-axis direction) in the vertical direction. In other words, the lower member 3210 may also overlap the second electrode 260 in the vertical direction, and a movement path of heat from the lower member 3210 to the second electrode 260 may be minimized. Accordingly, it is possible to improve efficiency for heat reception/heat absorption.

In addition, as described above, the bonding member CU may be disposed between the heat sink 3000 and the thermoelectric element 200, particularly, the second substrate 280. As described above, the bonding member CU may be made of a material having thermal conductivity and heat resistance. For example, the bonding member CU may have heat resistance against a high temperature of a fluid passing through the heat sink 3000.

The bonding member CU may be seated in the groove G. In addition, the bonding member CU may be positioned under the lower member 3210.

In an embodiment, the bonding member CU may be positioned only in the groove G. Accordingly, the second member region PP2 of the lower member 3210 may come into contact with an upper surface of the second substrate 280. In other words, the bonding member CU may be surrounded by the second member region PP2. With this configuration, it is possible to minimize the contact of the bonding member CU with external foreign substances or fluids, thereby improving the reliability of the thermoelectric device. More specifically, since the bonding member CU is disposed in the groove G of the lower member 3210, it is possible to minimize the separation distance between the lower member 3210 and the second substrate 280. Accordingly, it is possible to improve the coupling force between the second substrate 280 and the heat sink 3000, thereby improving reliability as described above. In addition, heat exchange between the second substrate 280 and the heat sink 3000 may also occur more efficiently. In addition, when the separation distance between the second substrate 280 and the heat sink 3000 is increased, a length of the heat sink to have a movement area of the fluid corresponding to a desired differential pressure is limited. In other words, since a limit on the length of the extension member is present, a problem of lowering the heat exchange rate of the heat sink occurs. In addition, when there is no groove G, an increase in differential pressure due to the bonding member is unavoidable to achieve a desired heat exchange rate, but unlike this, the thermoelectric device according to the embodiment may provide improved heat exchange rate, reliability, and decrease in differential pressure.

Furthermore, the bonding member CU may come into contact with both the lower member 3210 and the upper surface of the second substrate 280.

Accordingly, it is possible to improve the coupling force between the heat sink 3000 and the thermoelectric element 200.

In addition, the first member region PP1 of the lower member 3210 may at least partially overlap the second electrode 260. In addition, the second member region PP2 of the lower member 3210 may at least partially overlap the second electrode 260. With this configuration, it is possible to efficiently perform heat reception/heat absorption to the second electrode 260 through the lower member 3210.

In an embodiment, a position of the second member region PP2 of the lower member 3210 may vary depending on the separation distance SSL1 between adjacent extension members 3100. For example, the separation distance SSL1 between the adjacent extension members 3100 may be greater than a separation distance SSL6 in the first direction (X-axis direction) of the second electrode 260. In this case, the first member region PP1 and the second member region PP2 may at least partially overlap the second electrode 260 in the vertical direction (Z-axis direction). Accordingly, it is possible to decrease heat loss by decreasing the movement path of the heat.

In addition, when the separation distance SSL1 between the extension members 3100 is equal to or smaller than the separation distance SSL6 in the first direction (X-axis direction) of the second electrode 260, the second member region PP2 and the first member region PP1 may be positioned to overlap the second electrode 260 in the vertical direction (Z-axis direction). Accordingly, it is possible to improve the power generation performance of the thermoelectric device by minimizing the heat loss due to the heat movement.

In an embodiment, the groove G and the bonding member CU in the groove G extend in the second direction (Y-axis direction), and thus may be disposed along the second electrodes 260 arranged in the second direction (Y-axis direction). At this time, the bonding member CU may also be disposed between adjacent second electrodes 260 arranged in the second direction (the Y-axis direction).

In addition, the upper member 3220 also extends in the second direction (Y-axis direction), and thus may be disposed along the second electrodes 260 arranged in the second direction (Y-axis direction), and disposed to be spaced apart from the upper surface 280a of the second substrate 280 in the vertical direction.

In addition, in an embodiment, a length SSL2 of the groove G in the first direction (X-axis direction) may correspond to a length of the first member region PP1. In addition, the length SSL2 of the groove G in the first direction (X-axis direction) may be smaller than the separation distance SSL1 between the adjacent extension members 3100. In addition, a length SSL3 of the second member region PP2 may correspond to a difference between the separation distance SSL1 between the adjacent extension members 3100 and the length SSL2 of the groove G in the first direction (X-axis direction) (excluding the thicknesses of the lower member, the extension member, and the upper member).

In an embodiment, a ratio between the separation distance SSL1 between the adjacent extension members 3100 and the length SSL3 of the second member region PP2 may be 1:0.05 to 1:0.1. When the ratio is smaller than 1:0.05, there is a problem in that the bonding member overflows and manufacturing is difficult, and when the ratio is greater than 1:0.1, there is a problem in that heat exchange performance is lowered. At this time, the length SSL3 of the second member region PP2 corresponds to the separation distance between a side surface SS and the extension member 3100.

In addition, in an embodiment, a distance SSL4 between the upper member 3220 and the second substrate 280 (or the thermoelectric element) may be greater than a height of the groove or a length SSLS between a bottom surface BS of the groove and the second substrate 280 (or the thermoelectric element).

In addition, a ratio between the distance SSL4 between the upper member 3220 and the second substrate 280 (or the thermoelectric element) and the height of the groove or the length SSL3 between the bottom surface BS of the groove and the second substrate 280 (or the thermoelectric element) may be 1:0.1 to 1:0.1. When the ratio is smaller than 1:0.1, the bonding force by the bonding member CU is lowered, and when the ratio is greater than 1:0.1, the groove G and the bonding member decrease the movement of the fluid, so that there is a problem in that the differential pressure increases and heat exchange efficiency decreases, thereby lowering an amount of power generation.

In addition, the groove G may be composed of the bottom surface BS and the side surface SS. As described above, since the groove G protrudes from the lower member 3210 toward the upper member 3220, the bottom surface BS may be disposed between the lower member 3210 and the upper member 3220. The side surface SS of the groove may be disposed to surround the bottom surface BS of the groove G. In addition, the bottom surface BS of the groove G and the side surface SS of the groove G may have a curvature. For example, when the side surface SS of the groove G has a curvature, the above-described length (e.g., SL3) may be applied as an average.

In various embodiments, the groove G may have a curvature which is convex toward the second substrate 280 or a curvature which is convex toward the upper member 3220. Accordingly, when the bonding member CU reflows in the groove G, the bonding member CU may be expanded and contracted by temperature. Since a contact area between the bonding member CU and the lower member 3210 is increased when the groove G has the above-described curvature, it is possible to easily withstand an expansion pressure, thereby improving the reliability of the device.

For example, since the bonding area with the bonding member CU increases when the side surface SS and the bottom surface BS of the groove G have the curvature, the bonding force between the heat sink and the thermoelectric element may be increased.

In addition, as a modified example, a length of the lower member 3210 in the first direction (X-axis direction) may be different from a length of the upper member 3220 in the first direction. Accordingly, it is possible to improve the coupling force between the heat sink and the thermoelectric element.

In addition, even when the upper member 3220 obstructs the path of the fluid by the groove G of the lower member 3210, heat exchange may be maintained while decreasing the differential pressure by adjusting the length of the upper member 3220.

In addition, the lower member 3210 may be additionally disposed on both ends of the second substrate 280 in the first direction (X-axis direction). In addition, as described above, the groove G may be disposed on the lower member 3210, and the bonding member CU may be positioned in the groove G.

Accordingly, since the lower member 3210 in the heat sink 3000 is disposed on an outermost side of the second substrate 280 in the first direction (X-axis direction), it is possible to improve the coupling force between the edge of the heat sink 3000 and the second substrate 280. Accordingly, it is possible to improve the reliability of the thermoelectric device according to the embodiment.

Furthermore, since the upper member 3220 or the extension member 3100 in the heat sink 3000 is not disposed on the outermost side of the second substrate 280 in the first direction (X-axis direction), it is also possible to improve a support force by the second substrate 280.

FIG. 34 is a cross-sectional view of a thermoelectric device according to a fifth embodiment, and FIG. 35 is an enlarged view of portion K1 in FIG. 34.

As described above, the thermoelectric device according to the fifth embodiment may include a thermoelectric element 200, a heat sink 3000 disposed on the thermoelectric element 200, an electrode connection unit, and a bonding member CU.

In the fifth embodiment, the descriptions of the thermoelectric element 200, the heat sink 3000, the electrode connection unit, and the bonding member CU described above may be applied in the same manner except for contents to be described below.

First, according to the fifth embodiment, the bonding member CU disposed in a groove G may extend between a second member region PP2 of a lower member 3210 and the thermoelectric element 200.

More specifically, the bonding member CU may extend between the second member region PP2 of the lower member and a second substrate 280 (or an upper surface 280a of the second substrate).

At this time, the bonding member CU may include a first bonding region CU1 overlapping a first member region PP1, that is, the groove G in the vertical direction, and a second bonding region CU2 overlapping the second member region PP2 in the vertical direction.

A length of the first bonding region CU1 in the vertical direction (Z-axis direction) may be greater than a length of a side surface SS of the groove G in the vertical direction (Z-axis direction). In other words, the lower member 3210 of the heat sink may be disposed to be spaced apart from the thermoelectric element.

However, the bonding member CU is mostly positioned in the groove G, and thus may be disposed to overlap the lower member 3210 in the third direction (Z-axis direction). In addition, the bonding member CU may not overlap the upper member 3220 in the vertical direction. With this configuration, since the bonding member CU is positioned under the lower member 3210, an exposed surface of the bonding member CU may correspond to an interval between the lower member 3210 and the thermoelectric element. Accordingly, it is possible to minimize a contact area between fluids passing through the heat sink, thereby improving the reliability of the bonding member CU, that is, the reliability of the thermoelectric device.

In addition, in the bonding member CU, the length of the first bonding region CU1 in the vertical direction (Z-axis direction) may be smaller than a length of the second bonding region CU2 in the vertical direction (Z-axis direction). Accordingly, the bonding member CU may be positioned inside the second member region PP2.

In addition, the second bonding region CU2 may be positioned inside the second member region PP2 so that a separation space may be formed between the second member region PP2 and the thermoelectric element. Accordingly, since an interval between the second member region PP2 and the thermoelectric element is decreased, it may not be easy for the fluid passing through the heat sink to come into contact with the second bonding region CU2. Accordingly, it is possible to improve the reliability of the bonding member CU and the thermoelectric device.

FIG. 36 is a cross-sectional view of a thermoelectric device according to a sixth embodiment, and FIG. 37 is an enlarged view of portion K2 in FIG. 36.

As described above, the thermoelectric device according to the sixth embodiment may include a thermoelectric element 200, a heat sink 3000 disposed on the thermoelectric element 200, an electrode connection unit, and a bonding member CU.

In the sixth embodiment, the descriptions of the thermoelectric element 200, the heat sink 3000, the electrode connection unit, and the bonding member CU described above may be applied in the same manner except for contents to be described below.

First, according to the sixth embodiment, as described above, a groove G may include a bottom surface BS and a side surface SS. In addition, when the side surface SS is disposed to surround the bottom surface BS, the side surface SS may be disposed to be spaced apart from an edge of a second lower member 3210 by a predetermined distance.

At this time, the side surface SS may have a stepped portion ST. In an embodiment, a plurality of stepped portions ST may be provided.

Referring to the drawing, the side surface SS of the groove G may have a first side surface SS1, a second side surface SS2, and a third side surface SS3. The first side surface SS1 may come into contact with the bottom surface BS of the groove G. In addition, the second side surface SS2 may come into contact with the first side surface SS1 and the third side surface SS3 between the first side surface SS1 and the third side surface SS3. The second side surface SS2 may be a surface which is bent from the first side surface SS1 extending in the vertical direction SS1 at a predetermined angle. In addition, the third side surface SS3 may be a surface which comes into contact with the second side surface SS2 and is bent from the second side surface SS2 at a predetermined angle. The third side surface SS3 may extend in the same direction as that of the first side surface SS1.

In addition, as described above, the first side surface SS1, the second side surface SS2, and the third side surface SS3 may be positioned outside the bottom surface BS of the groove G and disposed to surround the bottom surface BS. Accordingly, a width of a region surrounded by the first side surface SS1 may be different from a width of a region surrounded by the third side surface SS3. In an embodiment, a width of the bottom surface BS in the first direction and a maximum width of the side surface SS in the first direction may be different from each other.

In addition, the width of the bottom surface BS in the first direction may be smaller than the maximum width of the side surface SS in the first direction. For example, the width of the region surrounded by the first side surface SS1 may be greater than the width of the region surrounded by the third side surface SS3. In other words, the side surface may be smaller as it is closer to the lower member.

Accordingly, the bonding member CU is positioned in the groove G and it is possible to maximally prevent the bonding member CU from extending between the second member region PP2 and the thermoelectric element. Accordingly, since surfaces coming into direct contact with each other between the heat sink and the thermoelectric element (particularly, the second substrate) are present, direct heat exchange from the heat sink to the thermoelectric element occurs, so that it is possible to improve the heat exchange through the bonding member. Furthermore, it is possible to prevent an increase in the area at which the flow of the fluid is inhibited by preventing the separation space between the heat sink 3000 and the thermoelectric element from being generated, thereby increasing the heat exchange rate.

Furthermore, the extension of the bonding member CU described in the fifth embodiment may also be applied to the sixth embodiment as another modified example.

FIGS. 38A to 38D are flowcharts showing a method of manufacturing the heat sink of the thermoelectric device according to the fourth embodiment.

Referring to FIG. 38A, a heat sink 3000A will be described below based on a structure that is not bent in a state before the heat sink 3000 described above is manufactured. In addition, a heat sink whose shape is transformed according to each process will be described as 300A, 300B, 300C, 300D, and the like. The heat sink 3000A may be positioned on a first mold MD1 having a predetermined recess R1. In addition, the heat sink 3000A may be pressed by a punch J1 corresponding to the recess R1 of the first mold MD1. This process may be performed repeatedly or simultaneously over the entire region of the heat sink 3000A.

Referring to FIG. 38B, the heat sink 3000B may have a shape corresponding to the shape of the recess R1 of the first mold MD1 by pressing. In other words, the heat sink 3000B may be bent to have an uneven structure. This may correspond to the lower member, the extension member, the upper member, and the extension member described in various embodiments.

Referring to FIG. 38C, a second mold MD2 may be inserted into a concave portion of the heat sink 3000C. The second mold MD2 may have a predetermined recess. A width ML2 of the recess in the second mold MD2 may be smaller than a width ML1 of the first recess R1 in the first mold MD1 described above.

In addition, one surface of the concave portion of the heat sink 3000C may be bent into the second mold MD2 by pressing a second punch J2. As described above, this pressing may be performed repeatedly or simultaneously on the entire region of the heat sink 3000C. In addition, the pressing may be performed in a direction opposite to the pressing described with reference to FIG. 38A. In addition, the pressing may be performed at a position corresponding to the lower member described above.

Referring to FIG. 38D, the heat sink 3000D may have the same shape as that of the heat sink described in the fourth embodiment. In addition, in the heat sink 3000D, the lower member may have a groove GA protruding from the lower member toward the upper member.

The thermoelectric element according to the embodiment of the present invention may be applied to power generation devices, cooling devices, heating devices, and the like.

In other words, the above-described contents may be applied to power generation devices including the thermoelectric element according to the embodiment, cooling devices, heating devices, transport bodies such as vehicles, or various electric devices in the same manner. For example, the power generation system may generate power through a heat source generated from ships, vehicles, power plants, geothermal heat, or the like. In addition, in the power generation system, a plurality of power generation devices may be arranged to efficiently converge the heat source. Accordingly, the heat source may be uniformly injected into the plurality of power generation devices through a plurality of branching units to make the heat applied to the heat sink uniform, thereby preventing the heat sink from being bent and improving the reliability of the power generation module (e.g., the thermoelectric device). In addition, it is possible to improve power generation efficiency by controlling the horizontal distance between the branching unit and the guide plate, thereby improving fuel efficiency of transportation devices such as ships or vehicles. Accordingly, it is possible to decrease a cost such as a transportation cost or a maintenance cost and create an eco-friendly industrial environment in shipping and transportation industries, and decrease a maintenance cost when applied to manufacturing industries such as steel mills.

Although the above has been described with reference to the exemplary embodiments of the present invention, those skilled in the art will be able to understand that the present invention may be variously modified and changed without departing from the spirit and scope of the present invention as set forth in the appended claims.

The invention claimed is:

1. A thermoelectric device, comprising:
a thermoelectric element including a first substrate, a plurality of first electrodes disposed on the first substrate, a plurality of P-type thermoelectric legs and a plurality of N-type thermoelectric legs disposed on the plurality of first electrodes, a plurality of second electrodes disposed on the plurality of P-type thermoelectric legs and the plurality of N-type thermoelectric legs, a second substrate disposed on the plurality of second electrodes, a first insulating layer formed between the first substrate and the plurality of first electrodes, and a second insulating layer formed between the second substrate and the plurality of second electrodes; and
a heat sink including a plurality of fins disposed to be spaced apart from each other on the second substrate,
wherein the second substrate includes a first region which overlaps the second electrode in a vertical direction, and a second region which does not overlap the second electrode in the vertical direction,
wherein the plurality of fins have different separation distances between adjacent fins in the first region and the second region,
wherein a first length of the second electrode in a first direction is smaller than a second length of the second electrode in a second direction perpendicular to the first direction,
wherein a vertical direction is a direction from the first substrate toward the second substrate, and
wherein the first direction and the second direction are perpendicular to the vertical direction, and
wherein the first region and the second region are alternately disposed in the first direction and the second direction.

2. The thermoelectric device of claim 1, wherein the separation distance is greater in the second region than in the first region.

3. The thermoelectric device of claim 1, wherein the second substrate includes a lower surface and an upper surface facing the lower surface, and
   the second electrode is disposed on the lower surface, and
      the upper surface comes into contact with the plurality of fins.

4. The thermoelectric device of claim 3, wherein the heat sink includes a connection member configured to connect the plurality of fins.

5. The thermoelectric device of claim 4, wherein the connection member includes:
   a first connection member coming into contact with the upper surface; and
   a second connection member facing the first connection member.

6. The thermoelectric device of claim 5, wherein the plurality of fins have one ends connected to the first connection member and the other ends connected to the second connection member.

7. The thermoelectric device of claim 5, wherein a length of the second connection member is greater in the second region than in the first region.

8. The thermoelectric device of claim 5, wherein the second region overlaps the second connection member in the vertical direction.

\* \* \* \* \*